US012642124B2

(12) United States Patent
Saito

(10) Patent No.: US 12,642,124 B2
(45) Date of Patent: May 26, 2026

(54) SEMICONDUCTOR DEVICE AND MANUFACTURING METHOD FOR SEMICONDUCTOR DEVICE

(71) Applicant: ROHM CO., LTD., Kyoto (JP)

(72) Inventor: Koshun Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 473 days.

(21) Appl. No.: 18/452,875

(22) Filed: Aug. 21, 2023

(65) Prior Publication Data

US 2023/0395451 A1     Dec. 7, 2023

Related U.S. Application Data

(63) Continuation of application No. PCT/JP2022/017044, filed on Apr. 4, 2022.

(30) Foreign Application Priority Data

Apr. 19, 2021     (JP) ................................. 2021-070259

(51) Int. Cl.
*H01L 21/56*          (2006.01)
*H01L 21/321*        (2006.01)
(Continued)

(52) U.S. Cl.
CPC ........ *H01L 23/3135* (2013.01); *H01L 21/321* (2013.01); *H01L 21/565* (2013.01);
(Continued)

(58) Field of Classification Search
CPC . H01L 23/3135; H01L 21/321; H01L 21/565; H01L 23/49562; H01L 24/32; H01L 24/40; H01L 24/73; H01L 25/072; H01L 2224/32245; H01L 2224/40245; H01L 2224/73213; H01L 2224/73263; H01L 2924/13091; H01L 23/49524; H01L 23/49548; H01L 23/3107; H01L 23/48; H01L 23/49575; H01L 23/49582
See application file for complete search history.

(56) References Cited

U.S. PATENT DOCUMENTS 6,927,483 B1     8/2005   Lee et al.

FOREIGN PATENT DOCUMENTS

JP          2019-176034          10/2019
JP          2020-027850          2/2020

OTHER PUBLICATIONS

International Search Report issued in International Application No. PCT/JP2022/017044, Jun. 21, 2022, 2 pages.
(Continued)

*Primary Examiner* — Elias Ullah
(74) *Attorney, Agent, or Firm* — HSML P.C.

(57) ABSTRACT

A semiconductor device includes a first lead, a second lead, a third lead, a semiconductor element, a sealing resin and a coating layer. The sealing resin has a bottom surface and an outer side surface. The bottom surface of the sealing resin is formed with a recess having an inner side surface. The second lead includes a reverse surface exposed at the bottom surface and a side surface exposed at the outer side surface. The coating layer contains a metal element and covers the reverse surface and the side surface. The recess is located between the first lead and the second lead. The second lead and at least one of the first lead and the third lead have inner end surfaces exposed at the inner side surface.

17 Claims, 38 Drawing Sheets

(51) Int. Cl.
    *H01L 23/00*        (2006.01)
    *H01L 23/31*        (2006.01)
    *H01L 23/495*      (2006.01)
    *H01L 25/07*        (2006.01)

(52) U.S. Cl.
    CPC ........ *H01L 23/49562* (2013.01); *H01L 24/32* (2013.01); *H01L 24/40* (2013.01); *H01L 24/73* (2013.01); *H01L 25/072* (2013.01); *H01L 2224/32245* (2013.01); *H01L 2224/40245* (2013.01); *H01L 2224/73213* (2013.01); *H01L 2224/73263* (2013.01); *H01L 2924/13091* (2013.01)

(56)                References Cited

OTHER PUBLICATIONS

Written Opinion issued in International Application No. PCT/JP2022/017044, Jun. 21, 2022, 2 pages.

FIG.45

SEMICONDUCTOR DEVICE AND MANUFACTURING METHOD FOR SEMICONDUCTOR DEVICE

TECHNICAL FIELD

The present disclosure relates to a semiconductor device and a method for manufacturing a semiconductor device.

BACKGROUND ART

JP-A-2020-27850 discloses an example of a semiconductor device. The semiconductor device includes a columnar conductor electrically connected to a semiconductor element. The columnar conductor has a reverse exposed surface and a side exposed surface that are exposed from a sealing resin. The semiconductor device further includes an external electrode that covers the reverse exposed surface and the side exposed surface. With the semiconductor device having such a configuration, when the semiconductor device is mounted on a wiring board, solder rises onto the portion of the external electrode that covers the side exposed surface. Thus, the state of bonding of the semiconductor device to the wiring board can be easily checked visually.

Forming the external electrode of the semiconductor device disclosed in JP-A-2020-27850 requires the step of exposing the side exposed surface of the columnar conductor from the sealing resin. This may decrease the manufacturing efficiency of the semiconductor device. Moreover, because the external electrode is formed by electroless plating, the deposition of the metal layer that will become the external electrode takes a relatively long time. This may further decrease the manufacturing efficiency of the semiconductor device.

BRIEF DESCRIPTION OF THE DRAWINGS

FIG. 45 is a bottom view of the semiconductor device shown in FIG. 44.

DETAILED DESCRIPTION OF EMBODIMENTS

Figure 1:
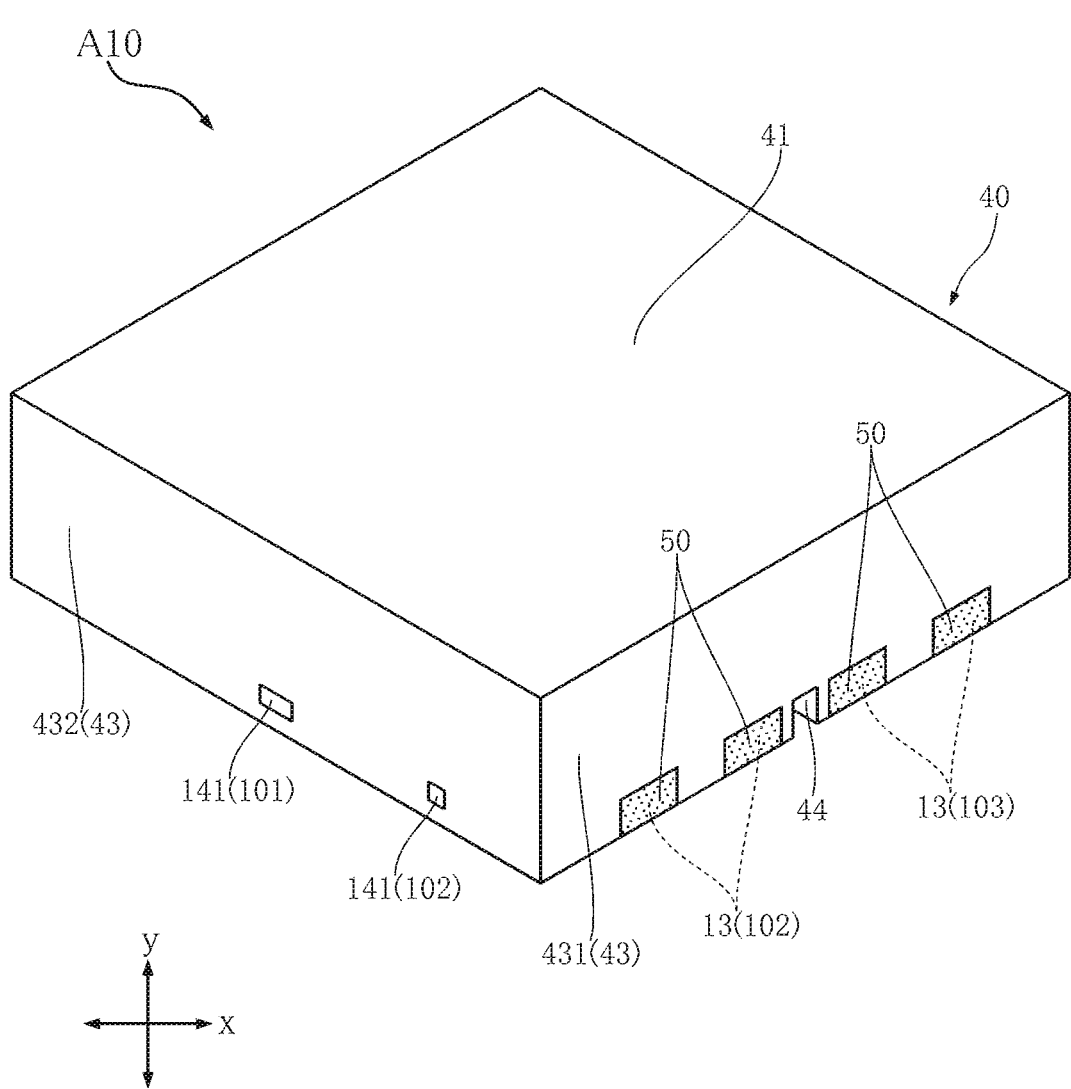
FIG. 1 is a perspective view of a semiconductor device according to a first embodiment of the present disclosure.

The following describes embodiments of the present disclosure with reference to the drawings.

A semiconductor device A10 according to a first embodiment of the present disclosure is described below based on FIGS. 1 to 11. The semiconductor device A10 is to be surface-mounted on a wiring board. The semiconductor device A10 includes a plurality of leads 10, a plurality of semiconductor elements 20, a plurality of conducting members 30, a sealing resin 40 and a coating layer 50. For convenience of understanding, the sealing resin 40 is transparent and indicated by imaginary lines (two-dot chain lines) in FIG. 2.

In the description of the semiconductor device A10, the thickness direction of the plurality of leads 10 (and hence, of any single lead 10) is defined as the "thickness direction z". A direction orthogonal to the thickness direction z is defined as the "first direction x". The direction orthogonal to the thickness direction z and the first direction x is defined as the "second direction y". The semiconductor device A10 is rectangular as viewed in the thickness direction z.

Figure 2:
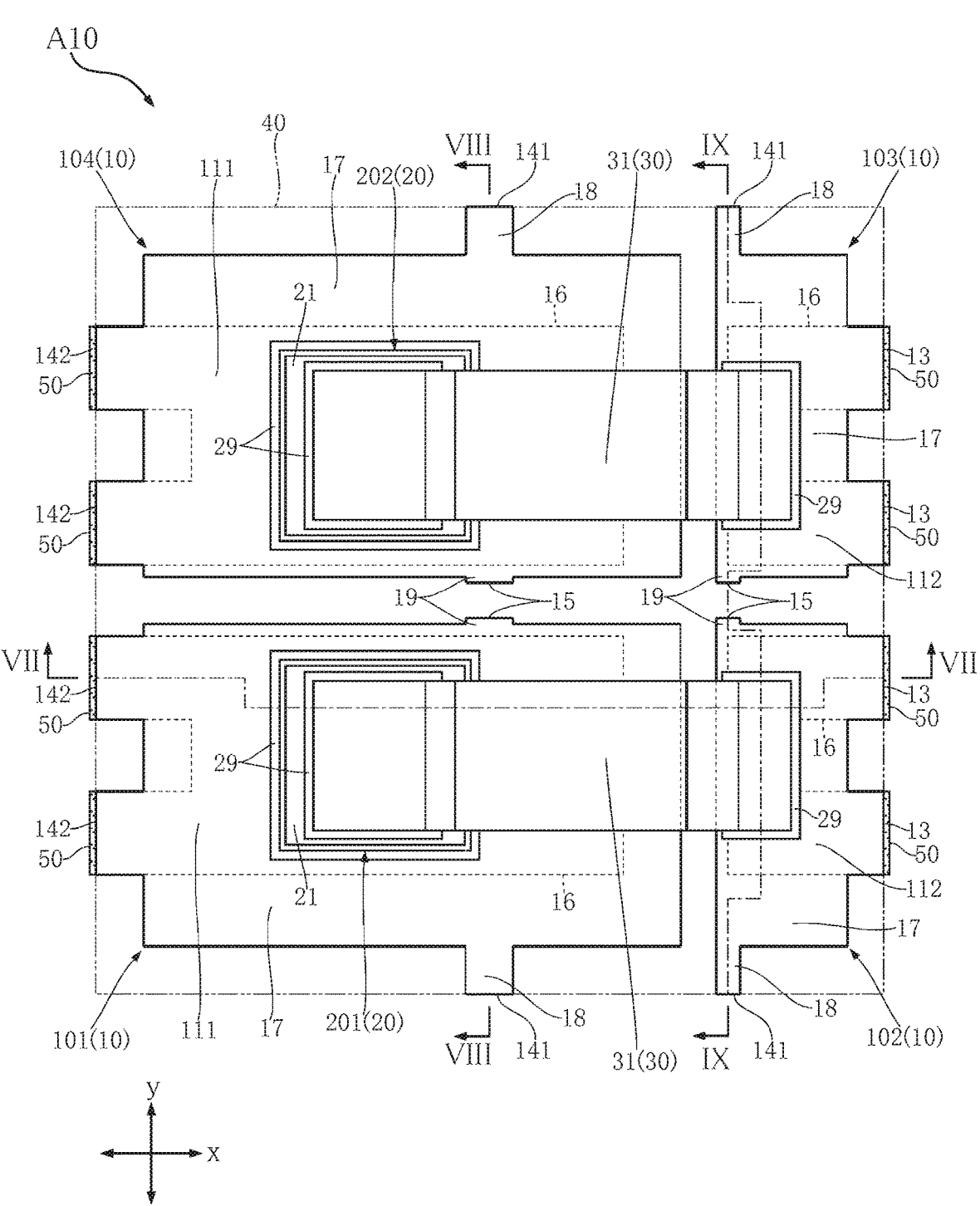
FIG. 2 is a plan view of the semiconductor device shown in FIG. 1, as seen through a sealing resin.

As shown in FIG. 2, the semiconductor elements 20 are mounted on the leads 10, and the leads 10 form portions of the conduction paths between the wiring board on which the semiconductor device A10 is mounted and the semiconductor elements 20. The leads 10 are formed from a common lead frame. Thus, all leads 10 have the same composition. The composition of the leads 10 includes copper (Cu). (That is, each lead 10 contains copper.) The plurality of leads 10 include a first lead 101, a second lead 102, a third lead 103 and a fourth lead 104.

As shown in FIG. 2, the second lead 102 is located next to the first lead 101 in the first direction x. The third lead 103 is located next to the second lead 102 in the second direction y. The fourth lead 104 is located next to the third lead 103 in the first direction x and located next to the first lead 101 in the second direction y.

As shown in FIGS. 2, 3, 7 and 9, each of the second lead 102 and the third lead 103 has an obverse surface 112, two reverse surfaces 122, two side surfaces 13, a first outer end surface 141, an inner end surface 15, an inner peripheral surface 16, an eave portion 17, an outer protrusion 18 and an inner protrusion 19.

Figure 3:
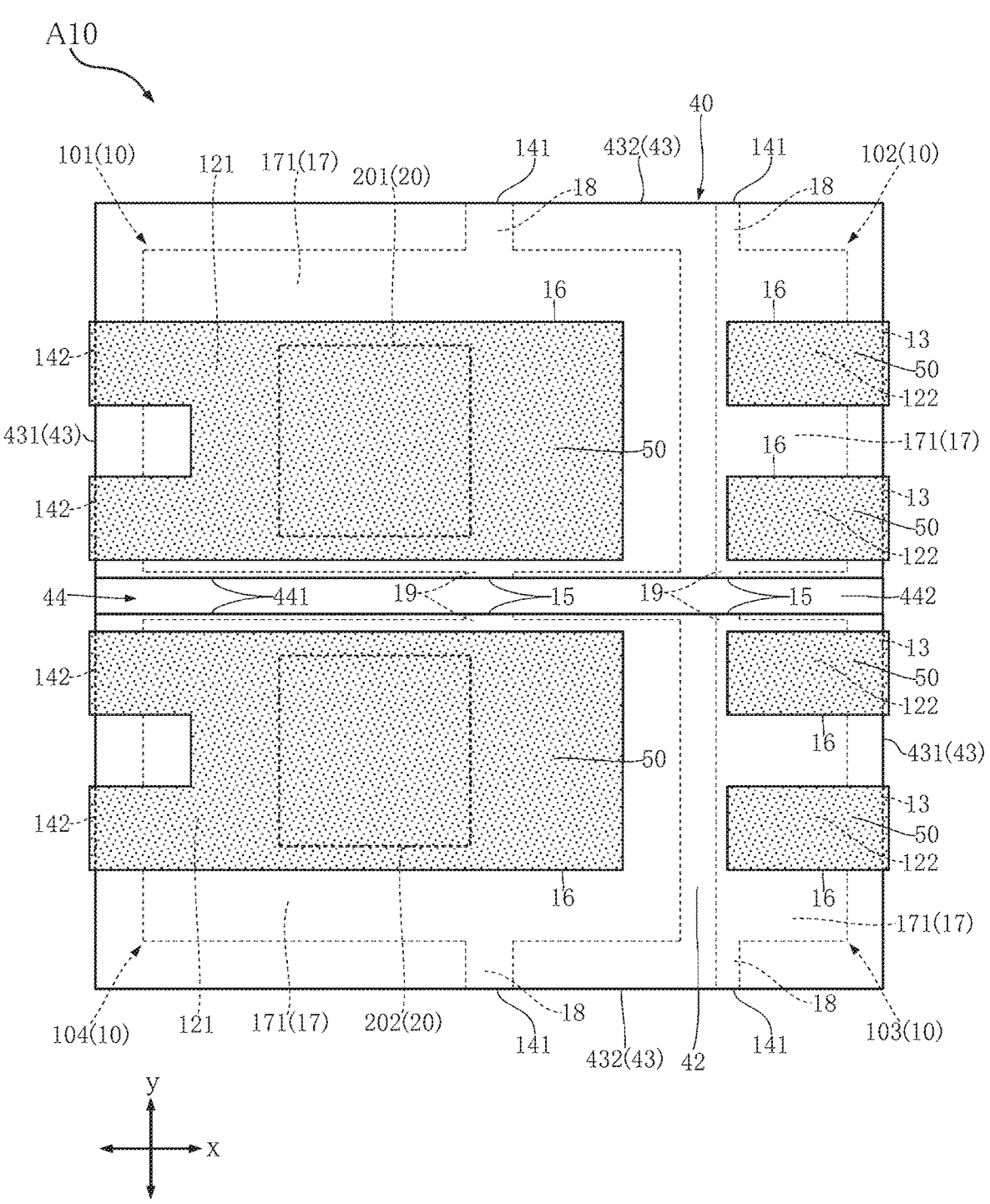
FIG. 3 is a bottom view of the semiconductor device shown in FIG. 1.
Figure 7:
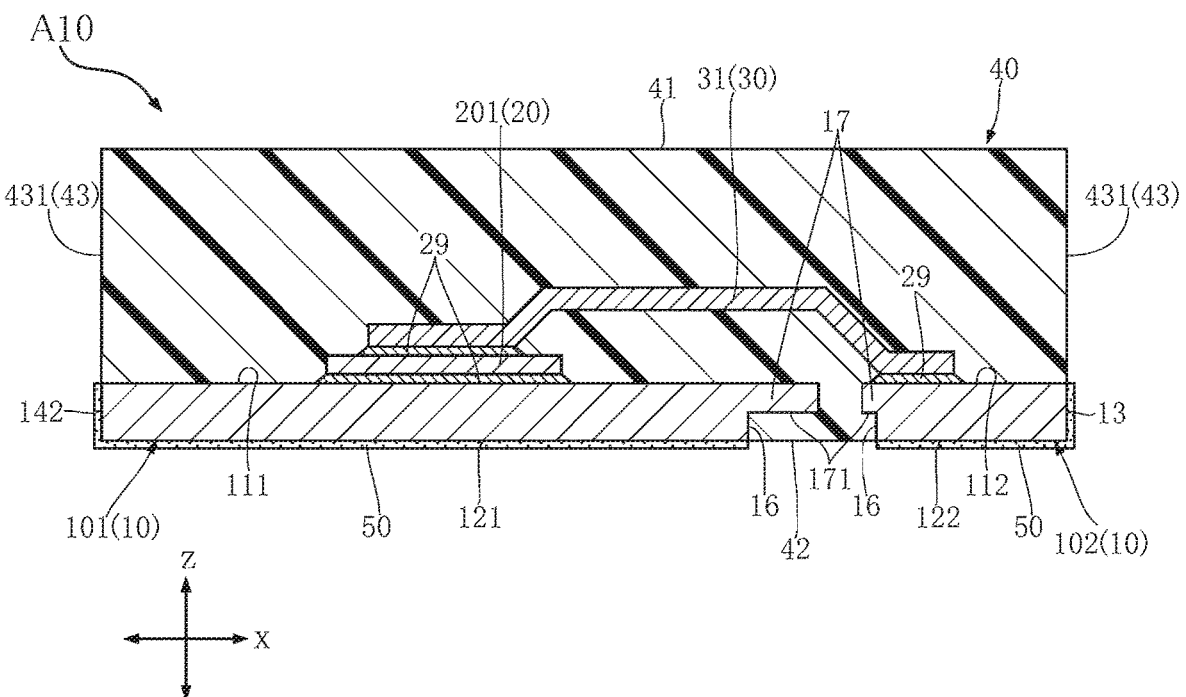
FIG. 7 is a sectional view taken along line VII-VII in FIG. 2.
Figure 9:
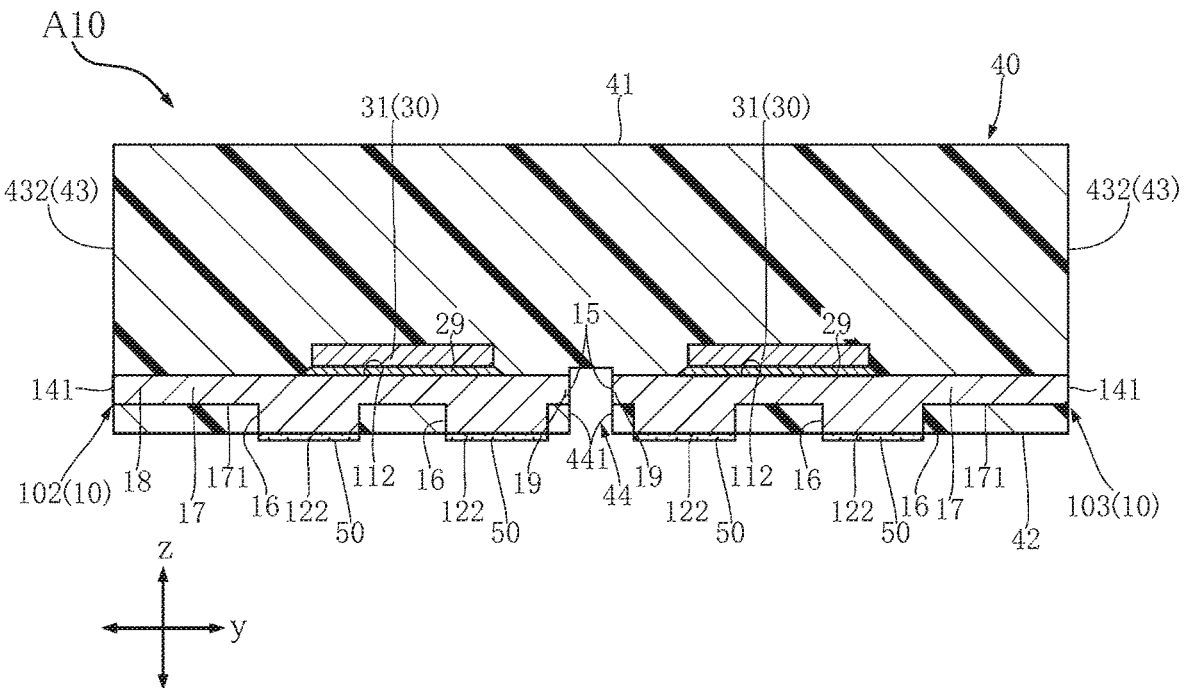
FIG. 9 is a sectional view taken along line IX-IX in FIG. 2.

As shown in FIGS. 7 and 9, the obverse surfaces 112 face in the thickness direction z. The obverse surfaces 112 are covered with the sealing resin 40. The two reverse surfaces 122 face away from the obverse surfaces 112 in the thickness direction z. The two obverse surfaces 112 are spaced apart from each other in the second direction y. The two reverse surfaces 122 are exposed from the sealing resin 40. As shown in FIGS. 3 and 7, the two side surfaces 13 are connected to the two reverse surfaces 122, respectively, and face in the first direction x. The two side surfaces 13 are exposed from the sealing resin 40.

As shown in FIGS. 2, 3, 6 and 9, the first outer end surface 141 faces outward from the sealing resin 40 in the second direction y. The first outer end surface 141 is exposed from the sealing resin 40. The area of the first outer end surface 141 is smaller than the area of each of the two side surfaces 13. The first outer end surface 141 is connected to the obverse surface 112 and spaced apart from the two reverse surfaces 122.

Figure 11:
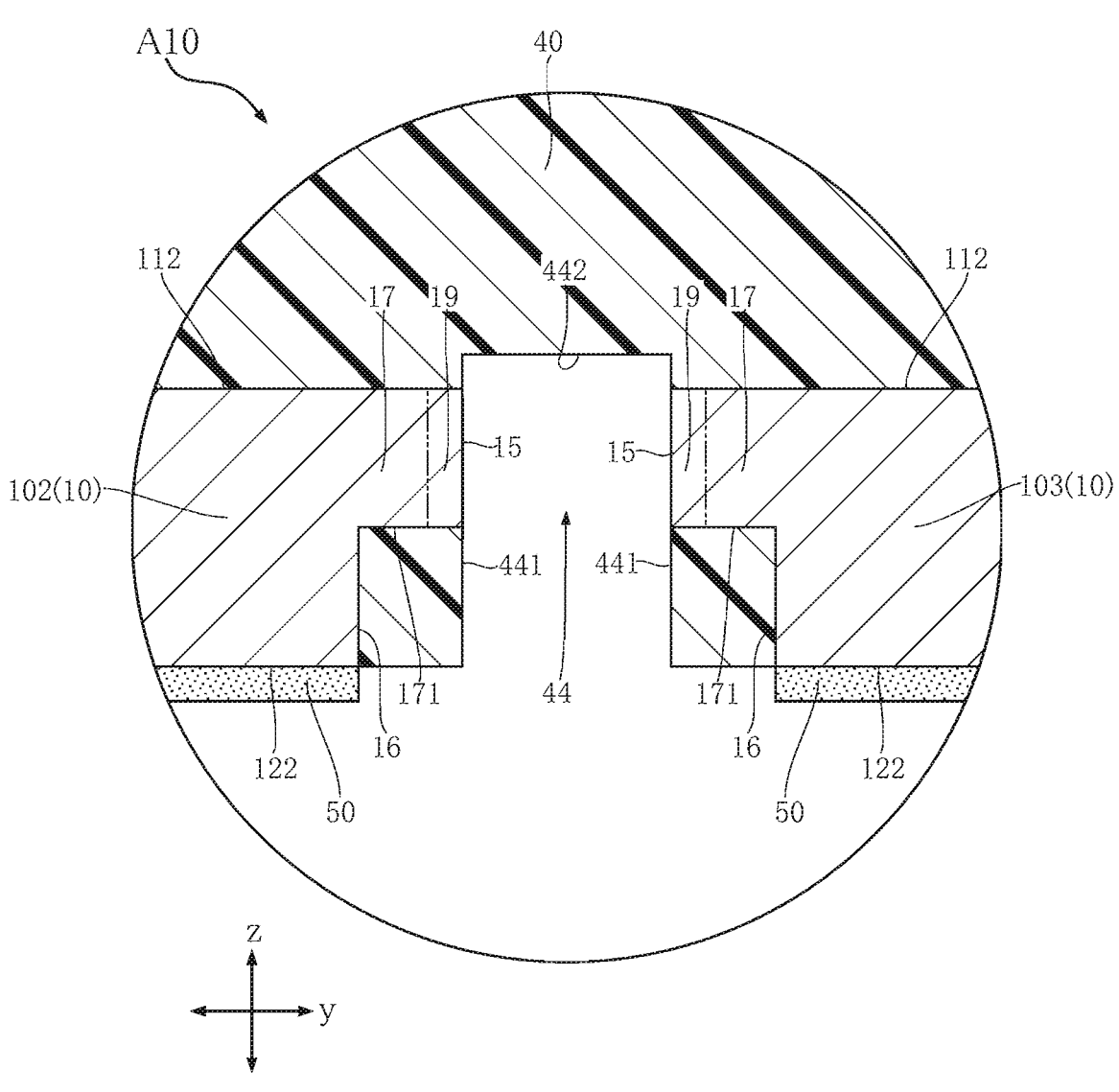
FIG. 11 is a partially enlarged view of FIG. 9.

As shown in FIGS. 2, 3 and 11, the inner end surface 15 faces inward in the sealing resin 40 in the second direction y. The inner end surface 15 is exposed from the sealing resin 40. The area of the inner end surface 15 is smaller than the area of each of the two side surfaces 13. The inner end surface 15 is connected to the obverse surface 112 and spaced apart from the two reverse surfaces 122 and the two side surfaces 13.

As shown in FIGS. 2, 3, 7 and 9, the inner peripheral surface 16 is connected to the two reverse surfaces 122 and faces in the directions orthogonal to the thickness direction z. The inner peripheral surface 16 is covered with the sealing resin 40.

As shown in FIGS. 2, 3, 7 and 9, the eave portion 17 protrudes from the inner peripheral surface 16 in the directions orthogonal to the thickness direction z. The eave portion 17 includes the obverse surface 112. The eave portion 17 has an overhang surface 171 that faces away from the obverse surface 112 in the thickness direction z. The overhang surface 171 is connected to the inner peripheral surface 16 and located between the obverse surface 112 and the two reverse surfaces 122 in the thickness direction z. The eave portion 17 is covered with the sealing resin 40.

As shown in FIGS. 2, 3 and 9, the outer protrusion 18 protrudes from the eave portion 17 toward the outside of the sealing resin 40 in the second direction y. The outer protrusion 18 includes the obverse surface 112 and the first outer end surface 141. The lower surface of the outer protrusion 18, which faces the same side as the two reverse surfaces 122 in the thickness direction z, is flush with the overhang surface 171 of the eave portion 17.

As shown in FIGS. 2, 3 and 11, the inner protrusion 19 protrudes from the eave portion 17 inward in the second direction y in the sealing resin 40. The inner protrusion 19 includes the obverse surface 112 and the inner end surface 15. The lower surface of the inner protrusion 19, which faces the same side as the two reverse surfaces 122 in the thickness direction z, is flush with the overhang surface 171 of the eave portion 17.

As shown in FIGS. 2, 3, 7 and 8, each of the first lead 101 and the fourth lead 104 has an element-mounting surface 111, a mounting surface 121, a first outer end surface 141, two second outer end surfaces 142, an inner end surface 15, an inner peripheral surface 16, an eave portion 17, an outer protrusion 18 and an inner protrusion 19. The inner end surface 15, the inner peripheral surface 16, the eave portion 17, the outer protrusion 18 and the inner protrusion 19 have the same configurations as those of the inner end surface 15, the inner peripheral surface 16, the eave portion 17, the outer protrusion 18 and the inner protrusion 19 of the second lead 102 and the third lead 103, and the explanation thereof is omitted.

As shown in FIG. 7, the element-mounting surface 111 faces the same side as the obverse surfaces 112 of the second lead 102 and the third lead 103 in the thickness direction z. The element-mounting surface 111 is covered with the sealing resin 40. One of the semiconductor elements 20 is mounted on the element-mounting surface 111. The mounting surface 121 faces away from the element-mounting surface 111 in the thickness direction z. The mounting surface 121 is exposed from the sealing resin 40. As shown in FIG. 3, the area of the mounting surface 121 is greater than the area of each of the two reverse surfaces 122 of the second lead 102 and the third lead 103.

As shown in FIGS. 2, 3, 6 and 8, the first outer end surface 141 of each of the first lead 101 and the fourth lead 104 faces outward from the sealing resin 40 in the second direction y.

Thus, the direction in which the first outer end surface 141 faces differs from the direction in which the two side surfaces 13 of each of the second lead 102 and the third lead 103 face. The first outer end surface 141 is exposed from the sealing resin 40. The area of the first outer end surface 141 is smaller than the area of each of the two side surfaces 13. The first outer end surface 141 is connected to the element-mounting surface 111 and spaced apart from the mounting surface 121.

As shown in FIGS. 3 and 7, the two second outer end surfaces 142 are connected to the mounting surface 121 and face in the first direction x. The two second outer end surfaces 142 have a normal direction coaxial with that of the two side surfaces 13 of each of the second lead 102 and the third lead 103, while also facing away from the two side surfaces 13. The two second outer end surfaces 142 are spaced apart from each other in the second direction y. The two second outer end surfaces 142 are exposed from the sealing resin 40. The area of each of the two second outer end surfaces 142 is larger than the area of the first outer end surface 141 of the first lead 101 and the fourth lead 104.

Figure 8:
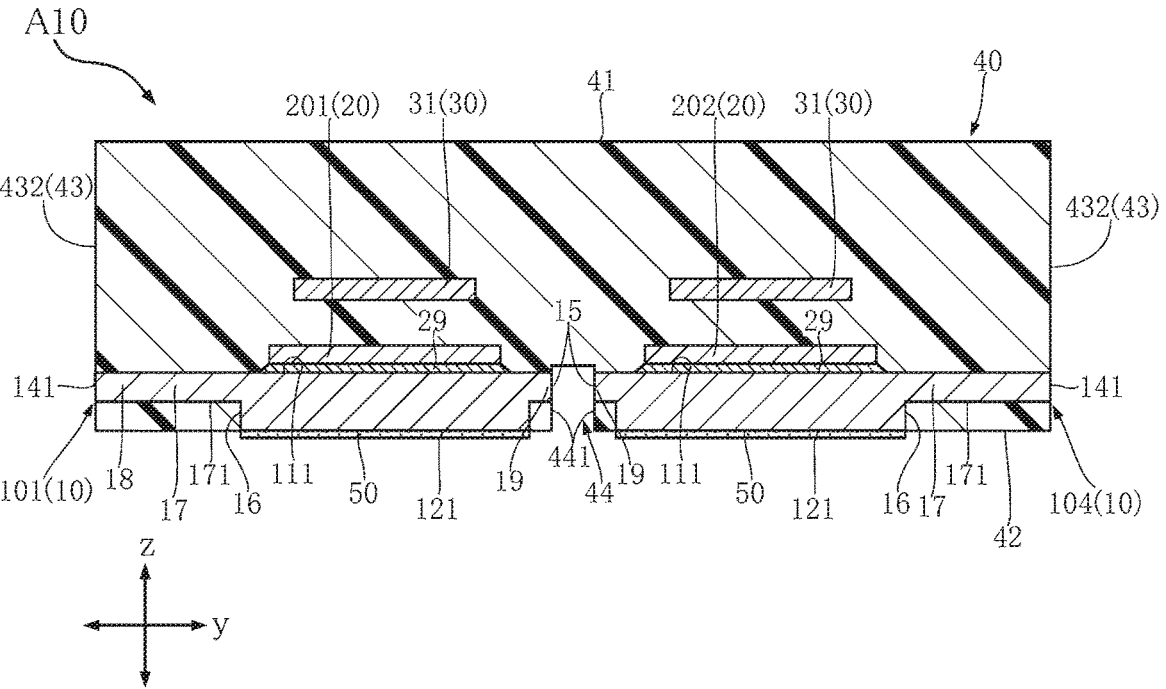
FIG. 8 is a sectional view taken along line VIII-VIII in FIG. 2.

As shown in FIGS. 2 and 8, the semiconductor elements 20 are mounted on the element-mounting surface 111 of the first lead 101 and the element-mounting surface 111 of the fourth lead 104, respectively. In the semiconductor device A10, the semiconductor elements 20 are diodes.

Figure 10:
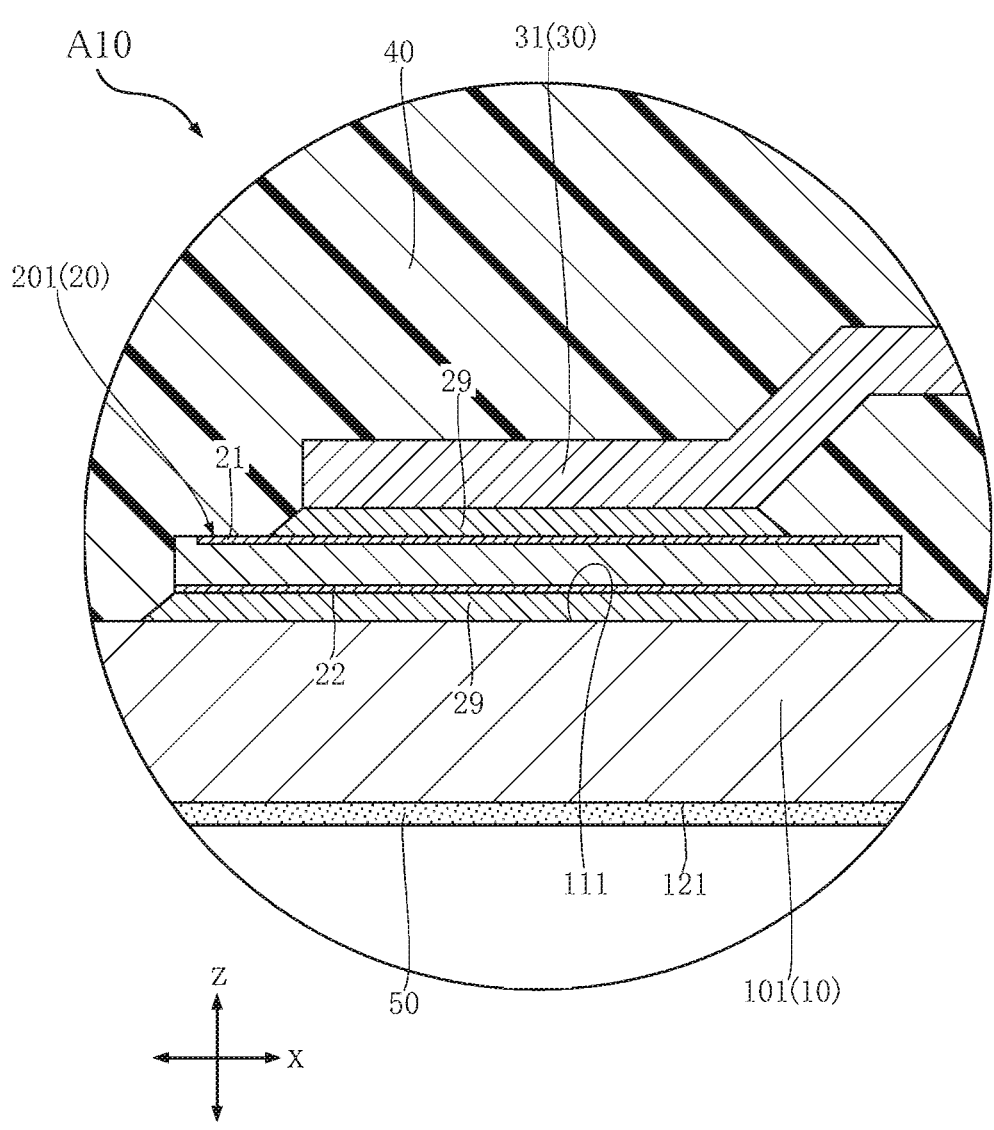
FIG. 10 is a partially enlarged view of FIG. 7.

As shown in FIG. 10, each of the semiconductor elements 20 has a first electrode 21 and a second electrode 22. The first electrode 21 is provided on a surface facing the same side as the element-mounting surface 111 of the first lead 101 faces. The first electrode 21 corresponds to an anode electrode.

Figure 42:
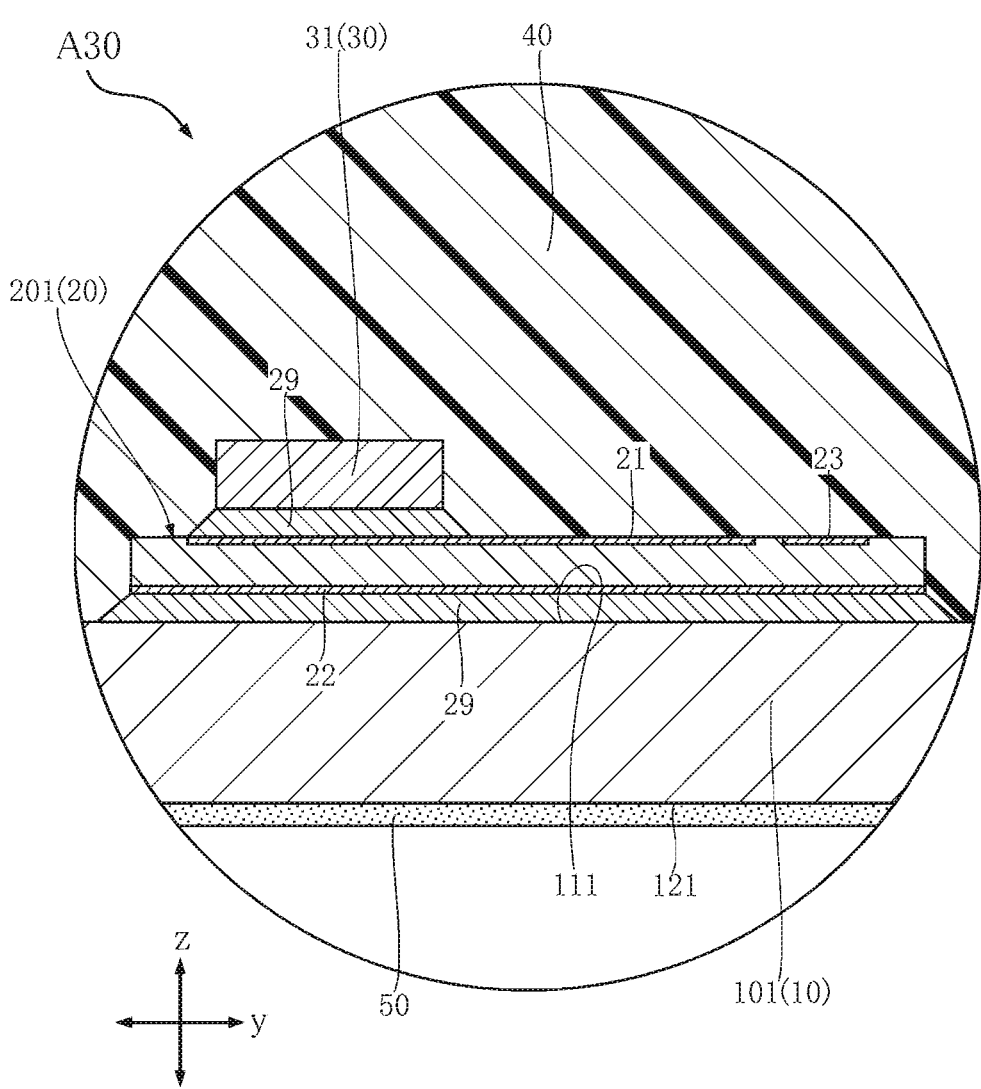
FIG. 42 is a sectional view taken along line XLII-XLII in FIG. 38.

As shown in FIG. 42, the second electrode 22 is provided on the opposite side of the first electrode 21 in the thickness direction z. The second electrode 22 faces the element-mounting surface 111 of the first lead 101 or the element-mounting surface 111 of the fourth lead 104. The second electrode 22 corresponds to a cathode electrode.

As shown in FIGS. 2 and 8, the plurality of semiconductor elements 20 include a first semiconductor element 201 and a second semiconductor element 202. The first semiconductor element 201 is mounted on the element-mounting surface 111 of the first lead 101. As shown in FIG. 10, the second electrode 22 of the first semiconductor element 201 is bonded to the element-mounting surface 111 of the first lead 101 via a bonding layer 29. The bonding layer 29 is electrically conductive. The bonding layer 29 is solder, for example. Alternatively, the bonding layer 29 may be a sintered metal containing silver (Ag), for example. Thus, the second electrode 22 of the first semiconductor element 201 is electrically connected to the first lead 101. The second electrode 22 of the second semiconductor element 202 is bonded to the element-mounting surface 111 of the fourth lead 104 via a bonding layer 29. Thus, the second electrode 22 of the second semiconductor element 202 is electrically connected to the fourth lead 104.

As shown in FIG. 2, the plurality of conducting members 30 include two first members 31. One of the two first members 31 is bonded to the first electrode 21 of the first semiconductor element 201 and the obverse surface 112 of the second lead 102 via bonding layers 29. Thus, the first electrode 21 of the first semiconductor element 201 is electrically connected to the second lead 102. The other of the two first members 31 is bonded to the first electrode 21 of the second semiconductor element 202 and the obverse surface 112 of the third lead 103 via bonding layers 29. Thus, the first electrode 21 of the second semiconductor element 202 is electrically connected to the third lead 103. The two first members 31 are metal clips. The composition of the two first members 31 includes copper. Alternatively, the two first members 31 may be wires.

Figure 4:
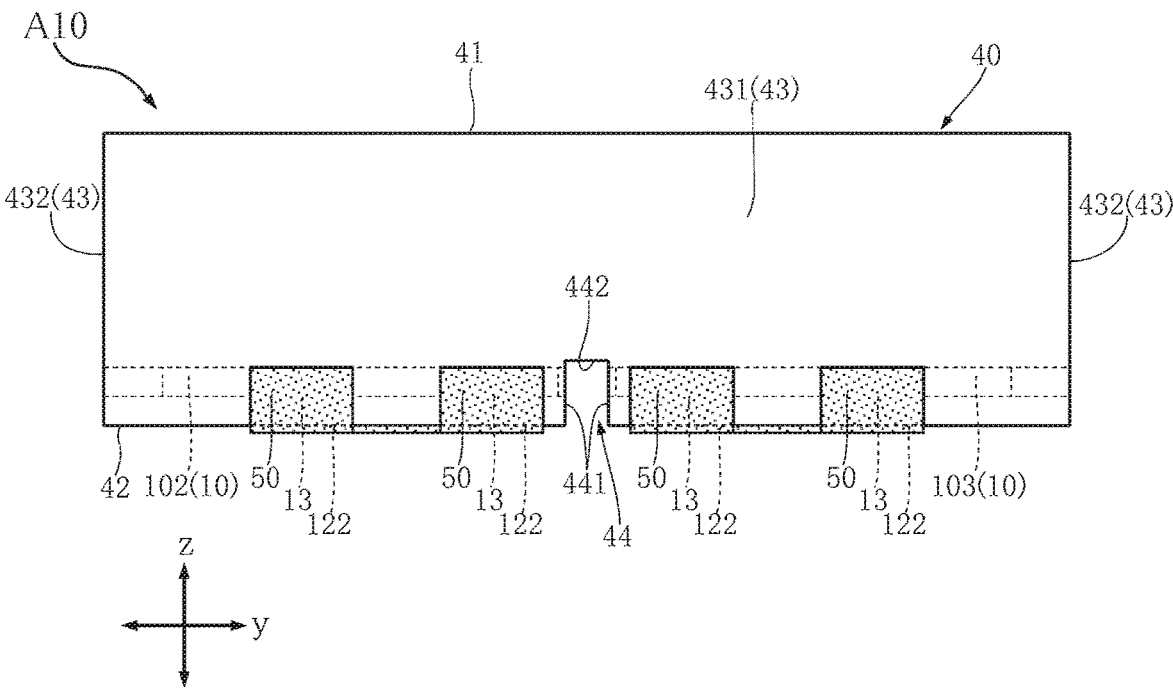
FIG. 4 is a right side view of the semiconductor device shown in FIG. 1.
Figure 5:
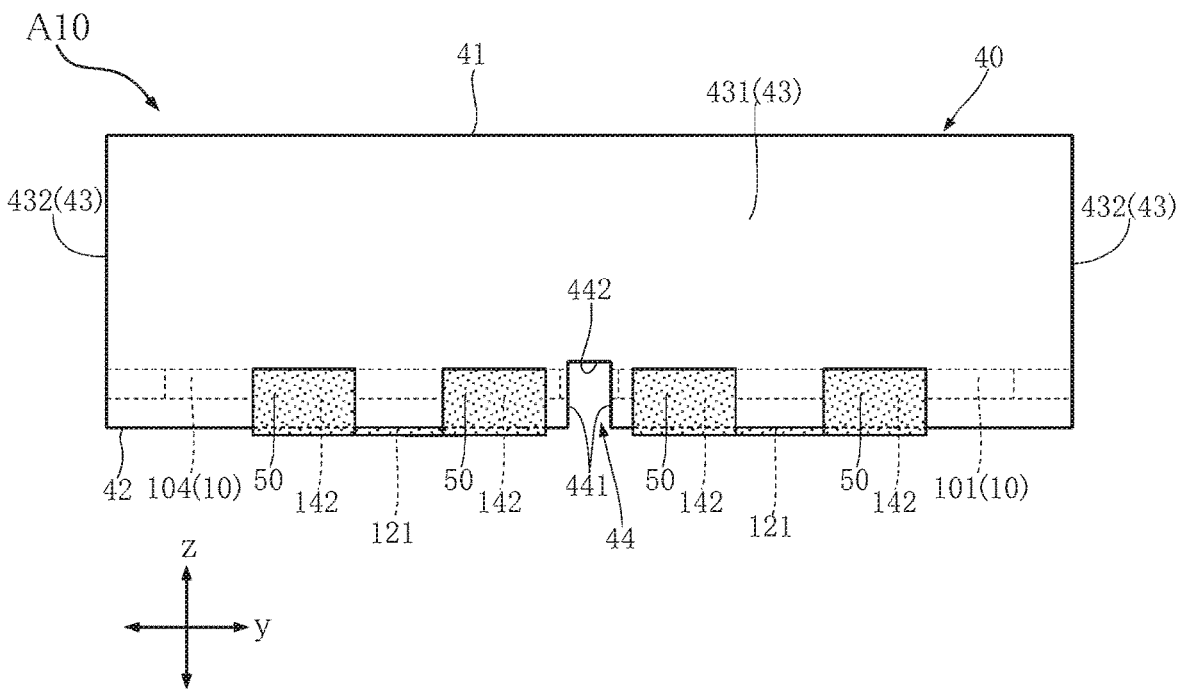
FIG. 5 is a left side view of the semiconductor device shown in FIG. 1.

As shown in FIGS. 7 to 9, the sealing resin 40 covers a part of each lead 10, the semiconductor elements 20, and the conducting members 30. The sealing resin 40 is electrically insulating. The sealing resin 40 is made of a material containing black epoxy resin, for example. As shown in FIGS. 4 and 5, the sealing resin 40 has a top surface 41, a bottom surface 42, an outer side surface 43 and a recess 44.

As shown in FIGS. 7 to 9, the top surface 41 and the bottom surface 42 face away from each other in the thickness direction z. The bottom surface 42 faces the same side as the two reverse surfaces 122 of each of the second lead 102 and the third lead 103 in the thickness direction z. The two reverse surfaces 122 and the mounting surfaces 121 of the first lead 101 and the fourth lead 104 are exposed at the bottom surface 42.

As shown in FIGS. 3 to 5, the outer side surface 43 is connected to the top surface 41 and the bottom surface 42 and faces outward from the sealing resin 40 in the directions orthogonal to the thickness direction z. The outer side surface 43 includes a pair of first surfaces 431 and a pair of second surfaces 432.

As shown in FIG. 3, the pair of first surfaces 431 face away from each other in the first direction x. As shown in FIGS. 4 and 7, the two side surfaces 13 of each of the second lead 102 and the third lead 103 are exposed at one of the pair of first surfaces 431. As shown in FIGS. 5 and 7, the two second outer end surfaces 142 of each of the first lead 101 and the fourth lead 104 are exposed at the other one of the pair of first surfaces 431.

Figure 6:
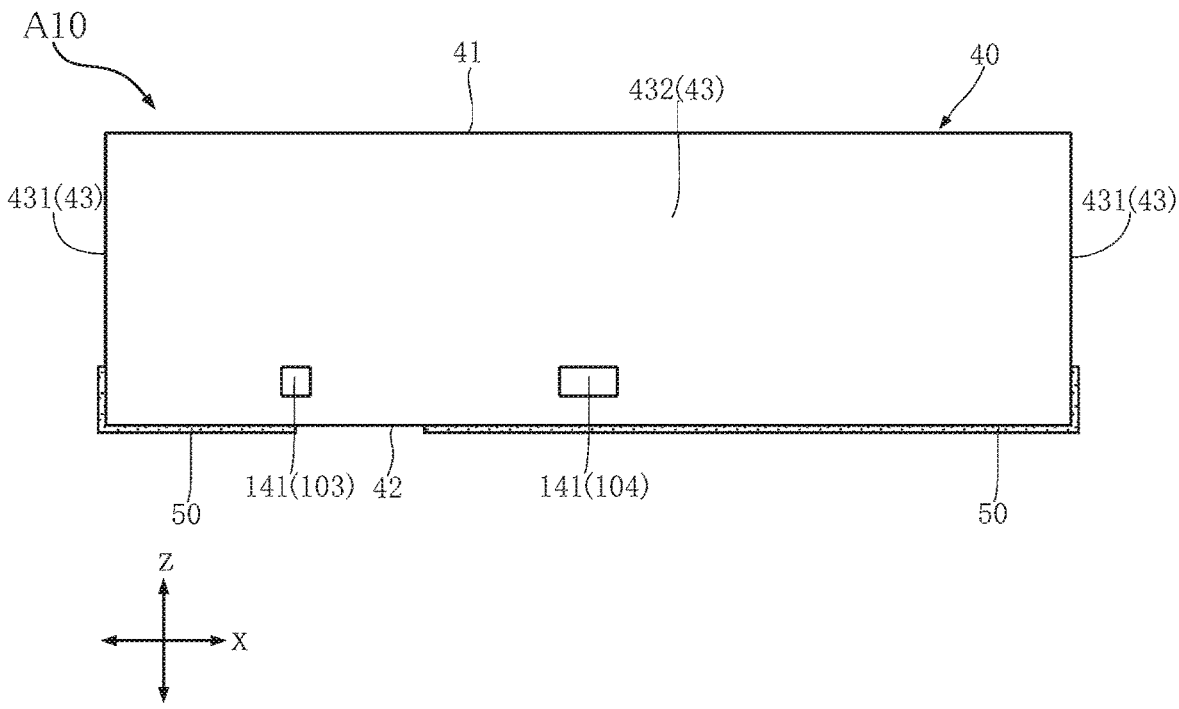
FIG. 6 is a rear view of the semiconductor device shown in FIG. 1.

As shown in FIG. 3, the pair of second surfaces 432 face away from each other in the second direction y. As shown in FIGS. 1, 8 and 9, the first outer end surface 141 of the first lead 101 and the first outer end surface 141 of the second lead 102 are exposed at one of the pair of second surfaces 432. As shown in FIGS. 6, 8 and 9, the first outer end surface 141 of the fourth lead 104 and the first outer end surface 141 of the third lead 103 are exposed at the other one of the pair of second surfaces 432.

As shown in FIGS. 3 to 5, the recess 44 is recessed from the bottom surface 42 in the thickness direction z. The recess 44 is a groove extending in a direction orthogonal to the thickness direction z. In the semiconductor device A10, the recess 44 extends in the first direction x. The opposite ends of the recess 44 in the first direction x are connected to the pair of first surfaces 431 of the outer side surface 43. Thus, the bottom surface 42 is divided by the recess 44 into two regions.

As shown in FIG. 3, the fourth lead 104 is located next to the first lead 101 with the recess 44 between them. The third lead 103 is located next to the second lead 102 with the recess 44 between them. As shown in FIG. 11, the recess 44 has an inner side surface 441. The inner side surface 441 is connected to the bottom surface 42 and faces inward in the sealing resin 40 in a direction orthogonal to the thickness direction z. The inner side surface 441 includes a pair of regions that are spaced apart from each other in the direction (the second direction y in the semiconductor device A10) that is orthogonal to the thickness direction z and the direction in which the recess 44 extends. The inner end surfaces 15 of the first lead 101 and the fourth lead 104 and the inner end surfaces 15 of the second lead 102 and the third lead 103 are exposed at the pair of regions.

As shown in FIG. 11, the recess 44 has an intermediate surface 442. The intermediate surface 442 faces the same side as the bottom surface 42 in the thickness direction z and is connected to the inner side surface 441. In the semiconductor device A10, the intermediate surface 442 is farther away from the bottom surface 42 than are the obverse surfaces 112 of the second lead 102 and the third lead 103 in the thickness direction z.

As shown in FIGS. 2, 3 and 7, the coating layer 50 covers the two reverse surfaces 122 and the two side surfaces 13 of each of the second lead 102 and the third lead 103. The coating layer 50 also covers the mounting surfaces 121 and the two second outer end surfaces 142 of each of the first lead 101 and the fourth lead 104. The first outer end surfaces 141 and the inner end surfaces 15 of the leads 10 are not covered with the coating layer 50. The composition of the coating layer 50 includes a metal element. The metal element is tin (Sn), for example. Alternatively, the metal element may include at least one of nickel (Ni), palladium (Pd) and gold. It is preferable that the metal element contained in the coating layer 50 has the property of improving the wettability of solder used in mounting the semiconductor device A10 to a wiring board.

Figure 18:
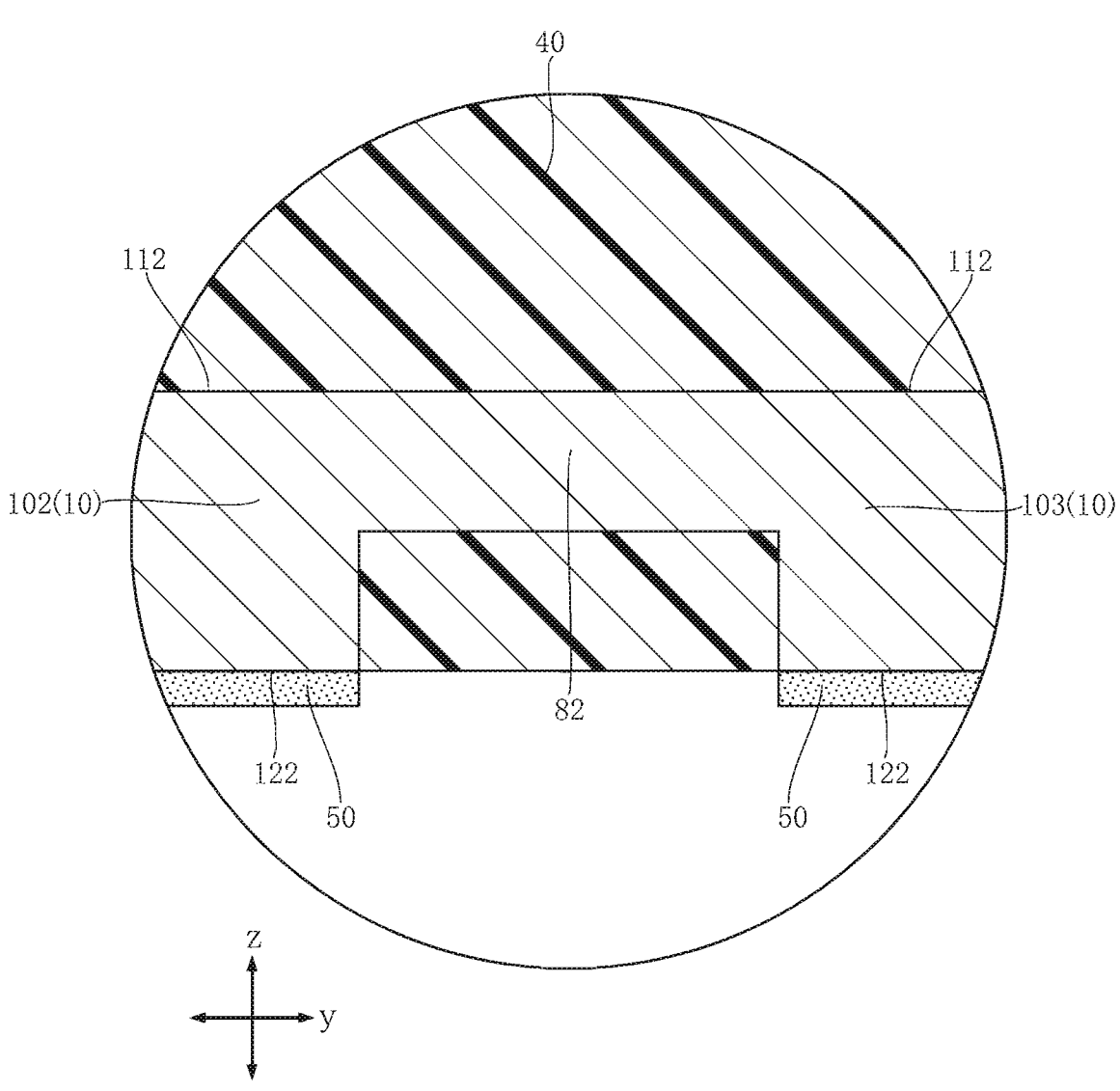
FIG. 18 is a partial enlarged sectional view for explaining a manufacturing step of the semiconductor device shown in FIG. 1.
Figure 19:
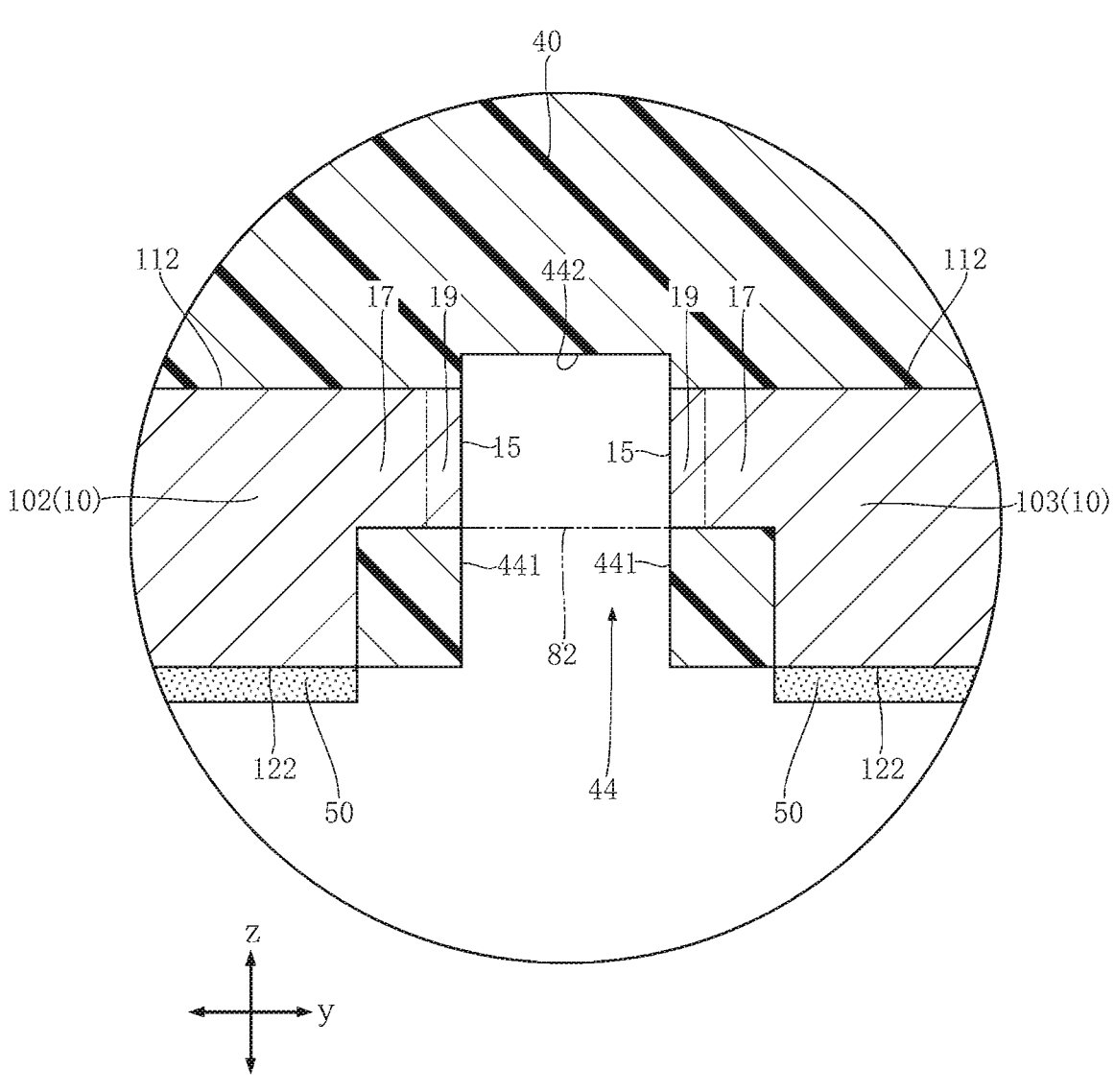
FIG. 19 is a partial enlarged sectional view for explaining a manufacturing step of the semiconductor device shown in FIG. 1.

An example of a method for manufacturing the semiconductor device A10 is described below based on FIGS. 12 to 20. Note that FIGS. 14 and 16 are sectional views taken along the same plane as FIG. 7. FIGS. 18 and 19 are sectional views taken along the same plane as FIG. 11.

Figure 12:
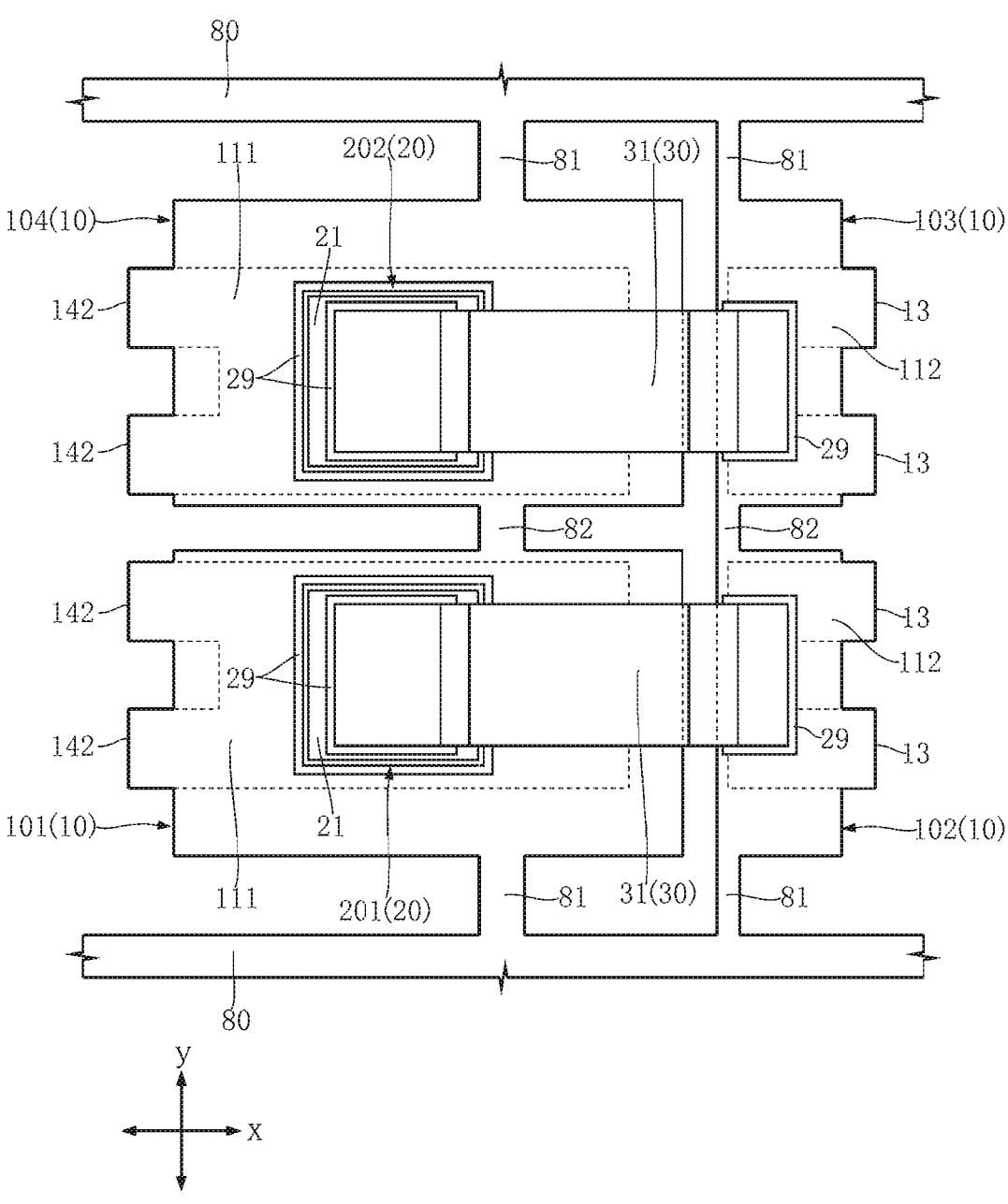
FIG. 12 is a plan view for explaining a manufacturing step of the semiconductor device shown in FIG. 1.

First, as shown in FIG. 12, semiconductor elements 20 are mounted on the element-mounting surfaces 111 of the first lead 101 and the fourth lead 104 of the plurality of leads 10. The element-mounting surfaces 111 are located on the opposite side of the reverse surfaces 122 of the second lead 102 and the third lead 103 in the thickness direction z. Thereafter, a conducting member 30 is bonded to the first electrode 21 of one of the semiconductor elements 20 and the obverse surface 112 of the second lead 102, and another conducting member 30 is bonded to the first electrode 21 of the other semiconductor element 20 and the obverse surface 112 of the third lead 103.

As shown in FIG. 12, the leads 10 are connected to a frame 80 via tie bars 81. At least two of the leads 10 are connected to each other via a connecting strip 82. In the semiconductor device A10, the first lead 101 and the fourth lead 104 are connected to each other via a connecting strip 82, so are the second lead 102 and the third lead 103. The frame 80, the tie bars 81 and the connecting strips 82 have the same composition as the leads 10. Thus, all of the frame 80, the tie bars 81 and the connecting strips 82 are electrically conductive.

Figure 13:
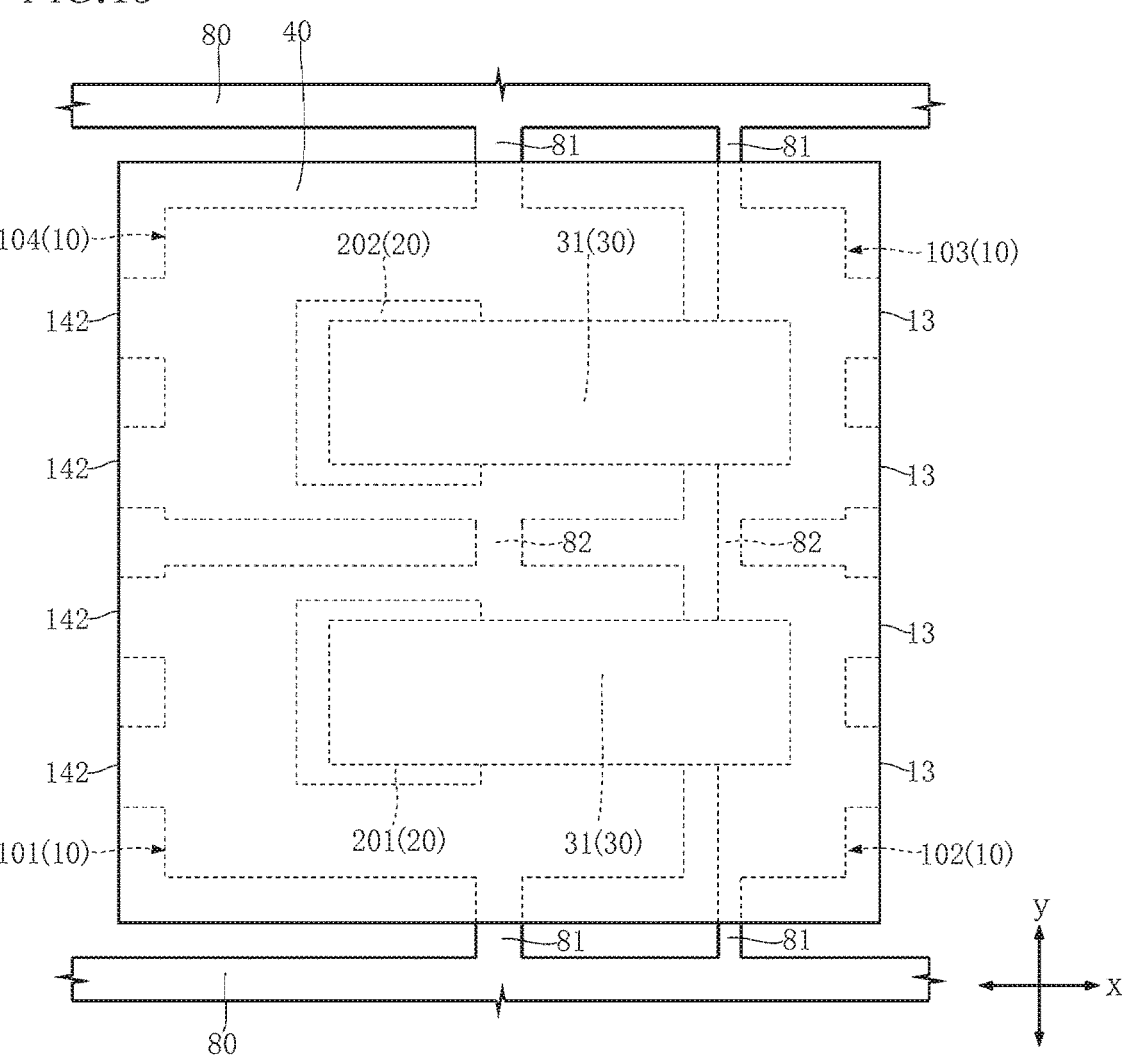
FIG. 13 is a plan view for explaining a manufacturing step of the semiconductor device shown in FIG. 1.
Figure 14:
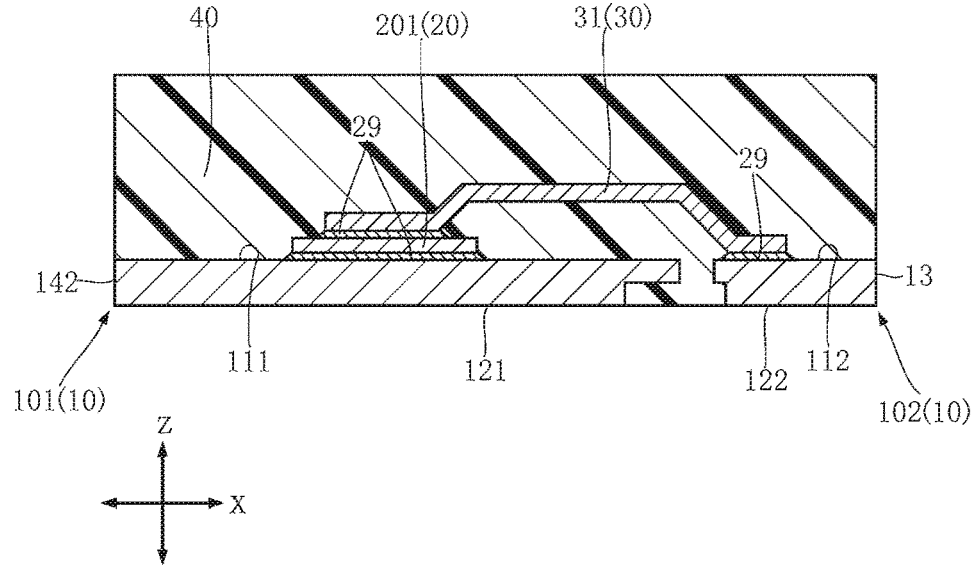
FIG. 14 is a sectional view for explaining a manufacturing step of the semiconductor device shown in FIG. 1.

Next, as shown in FIGS. 13 and 14, the sealing resin 40 covering a part of each lead 10, the semiconductor elements 20, and the conducting members 30 is formed. The sealing resin 40 is formed by transfer molding. In this step, the reverse surfaces 122 and the side surfaces 13 of at least one of the leads 10 (the second lead 102 and the third lead 103) are exposed from the sealing resin 40. In this step, the mounting surface 121 and the two second outer end surfaces 142 of each of the first lead 101 and the fourth lead 104 are also exposed from the sealing resin 40.

Figure 15:
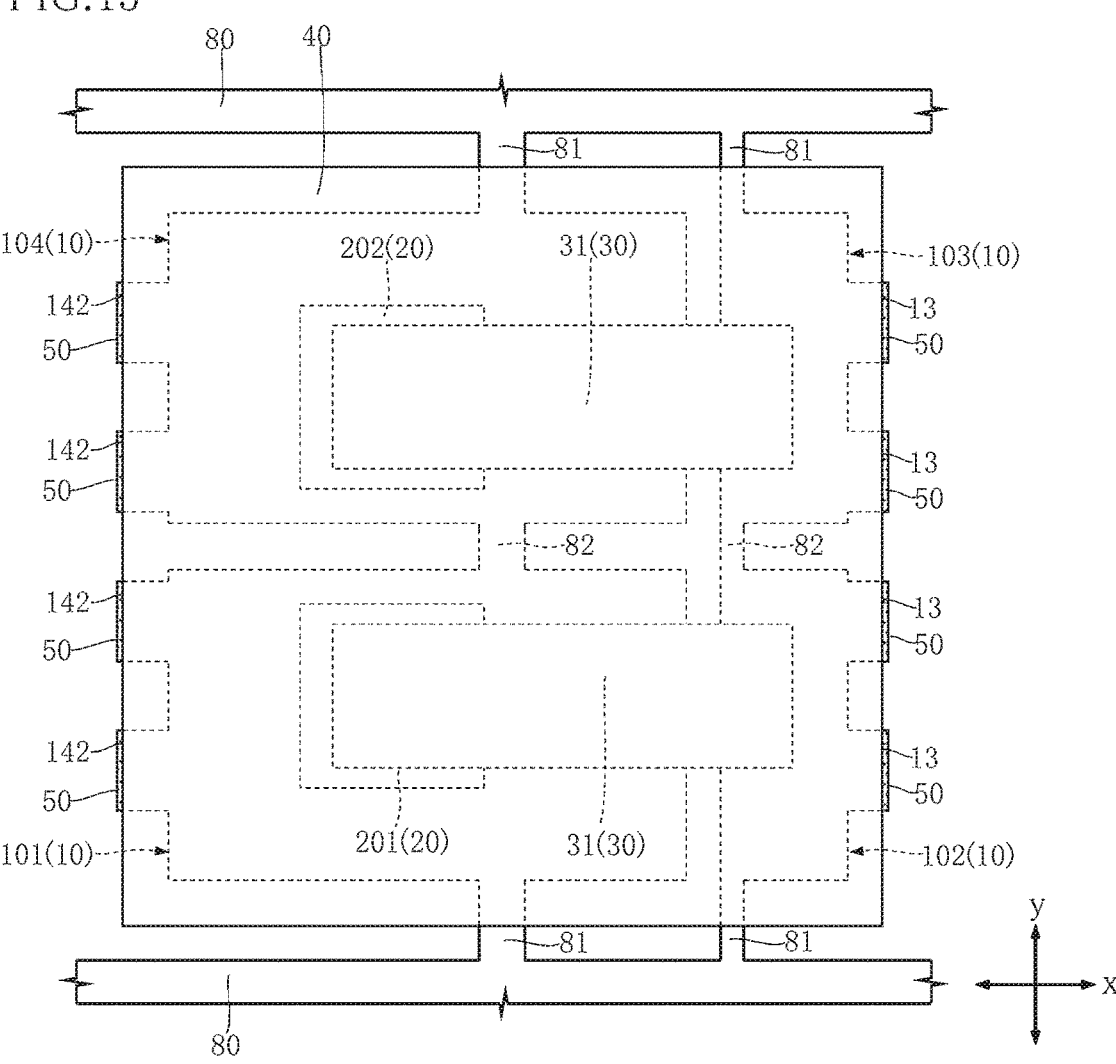
FIG. 15 is a plan view for explaining a manufacturing step of the semiconductor device shown in FIG. 1.
Figure 16:
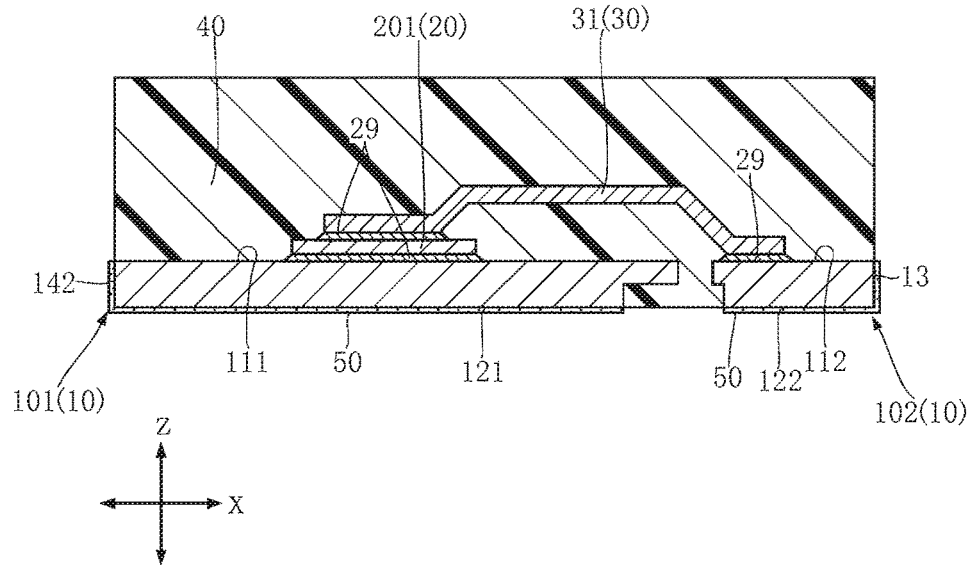
FIG. 16 is a sectional view for explaining a manufacturing step of the semiconductor device shown in FIG. 1.

Next, as shown in FIGS. 15 and 16, the coating layer 50 covering the reverse surfaces 122 and the side surfaces 13 exposed from the sealing resin 40 and including a metal element in its composition is formed by electrolytic plating. The coating layer 50 is a tin plating layer, for example. In this step, the mounting surface 121 and the two second outer end surfaces 142 of each of the first lead 101 and the fourth lead 104 are also covered with the coating layer 50.

Figure 17:
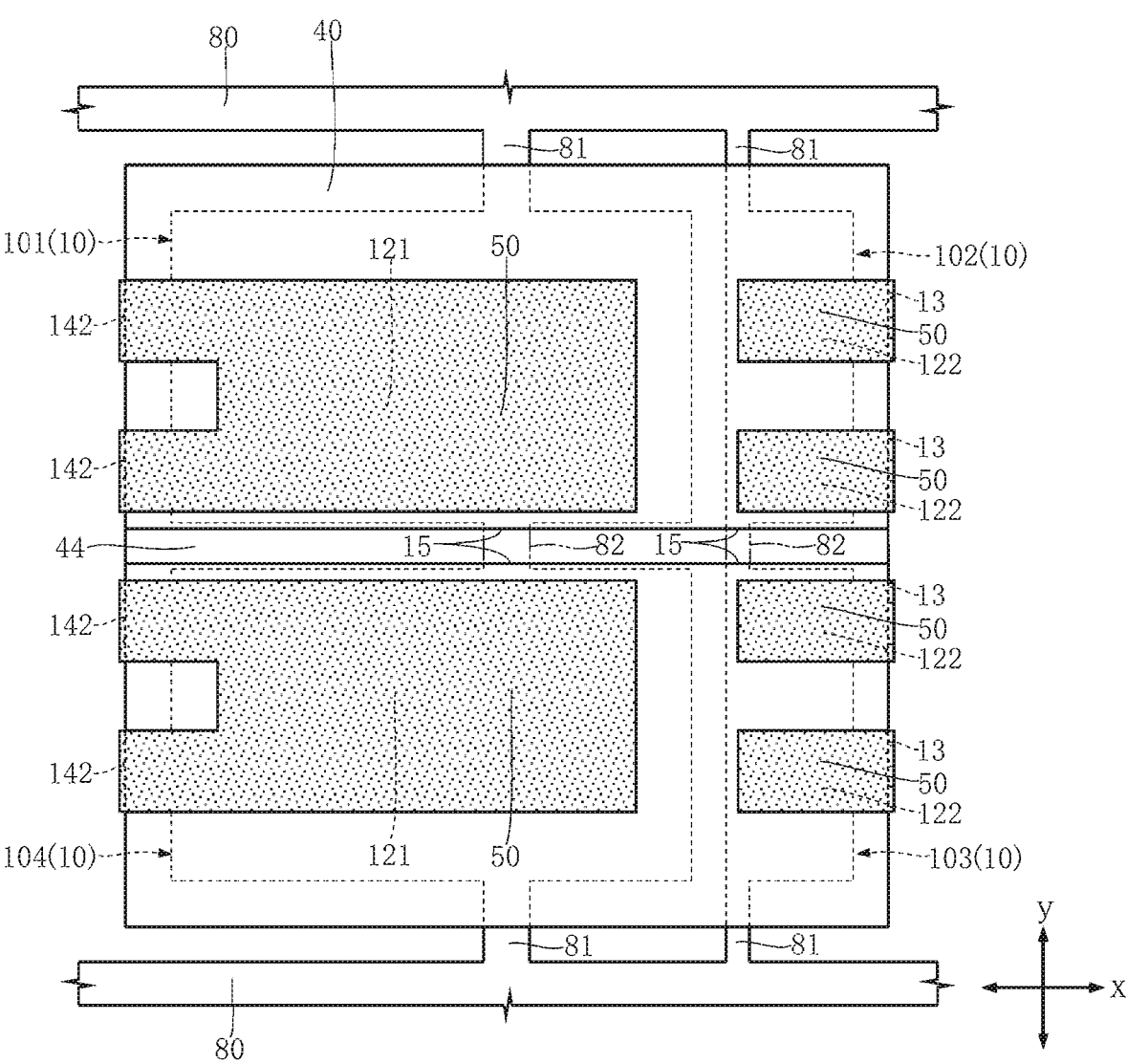
FIG. 17 is a bottom view for explaining a manufacturing step of the semiconductor device shown in FIG. 1.

Next, as shown in FIG. 17, the connecting strips 82 are cut by removing a part of the sealing resin 40 from the side on which the reverse surfaces 122 are exposed in the thickness direction z. The cutting of the connecting strips 82 is performed by using a cutting apparatus such as a dicing blade or a laser. FIG. 18 shows two leads 10 before a connecting strip 82 is cut. FIG. 19 shows two leads 10 after the connecting strip 82 is cut. As shown in FIG. 19, by this step, the recess 44 is formed in the sealing resin 40, and the inner end surfaces 15 emerge from the two leads 10 that have been connected to each other by a connecting strip 82.

Figure 20:
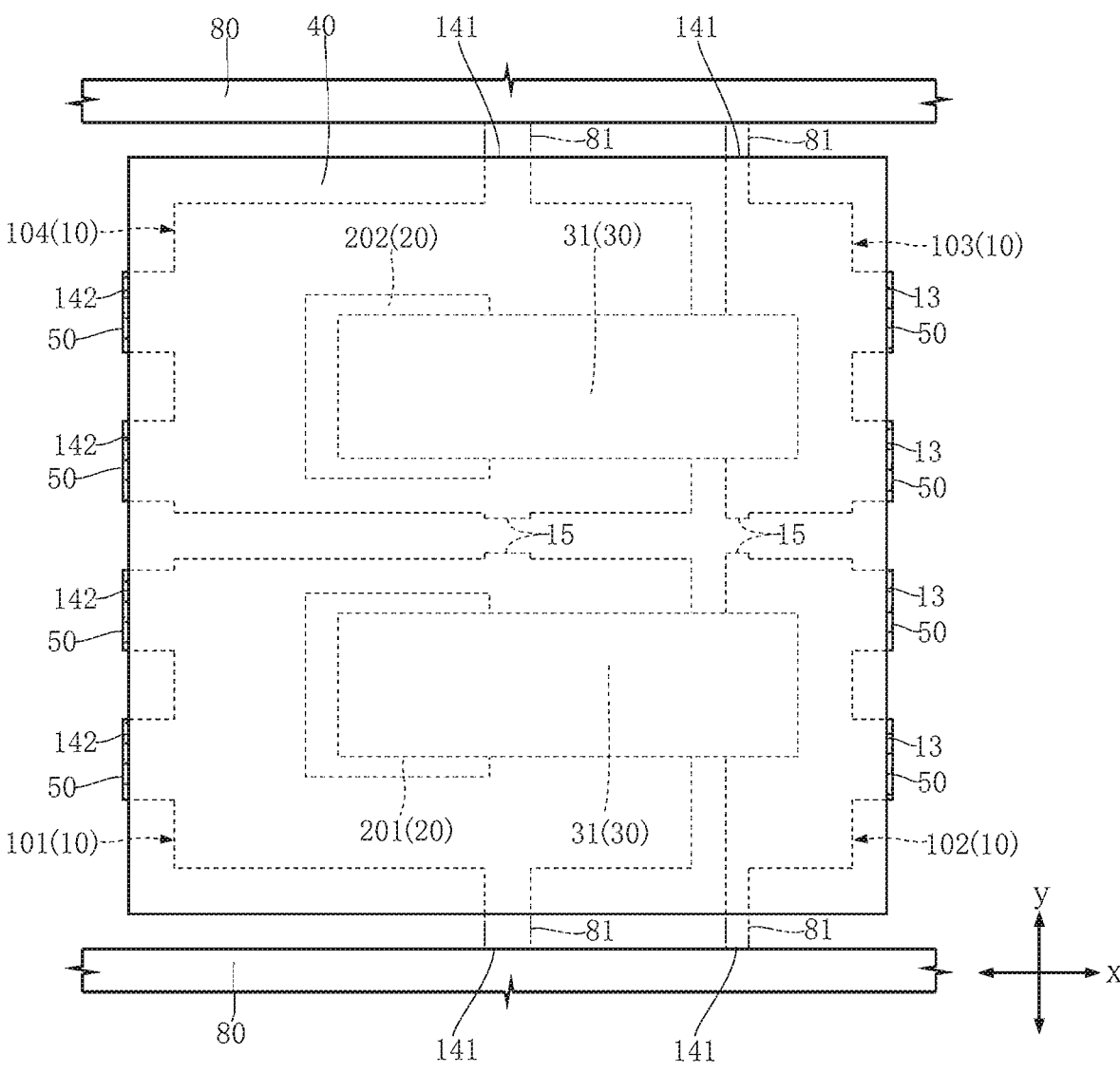
FIG. 20 is a plan view for explaining a manufacturing step of the semiconductor device shown in FIG. 1.

Finally, as shown in FIG. 20, the leads 10 are separated from the frame 80 by cutting the tie bars 81. By this step, the first outer end surfaces 141 emerge from the leads 10 that have been connected to each other by tie bars 81. Through the steps described above, the semiconductor device A10 is obtained.

A semiconductor device A11 that is a first variation of the semiconductor device A10 is described below based on FIG. 21. Note that FIG. 21 is a sectional view taken along the same plane as FIG. 11.

Figure 21:
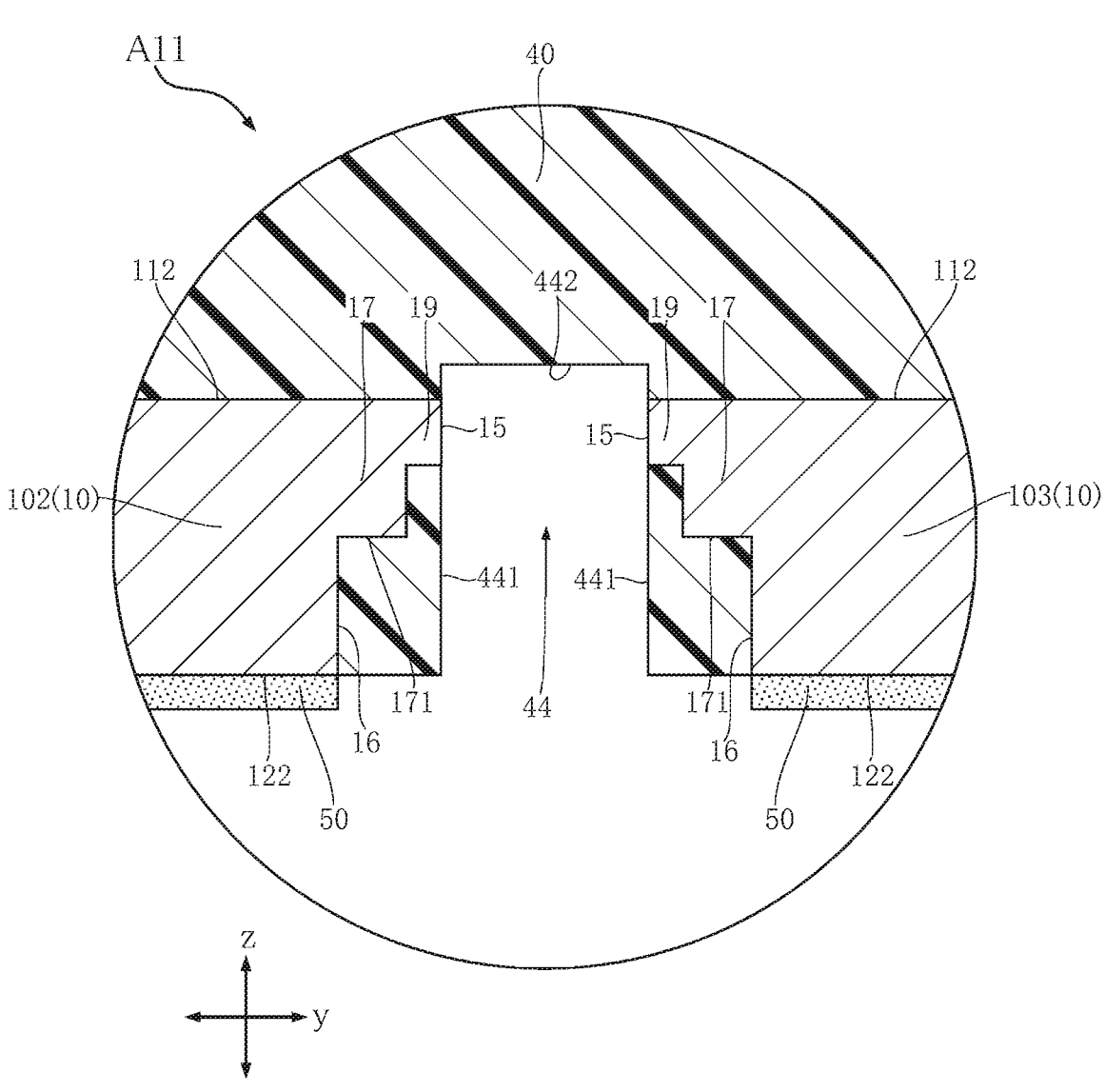
FIG. 21 is a partial enlarged sectional view of a first variation of the semiconductor device shown in FIG. 1.

As shown in FIG. 21, the semiconductor device A11 differs from the semiconductor device A10 in configurations of the inner end surfaces 15 and the inner protrusions 19 of the second lead 102 and the third lead 103. The lower surfaces of the inner protrusions 19, which face the same side as the reverse surfaces 122 in the thickness direction z, are offset from the overhang surfaces 171 of the eave portions 17 toward the obverse surfaces 112 in the thickness direction z. The upper surfaces of the inner protrusions 19, which face the same side as the obverse surfaces 112 in the thickness direction z, correspond to the obverse surfaces 112. The inner end surfaces 15 are connected to the obverse surfaces 112. With such a configuration, the area of each inner end surface 15 is smaller than the area of the inner end surface 15 of each of the second lead 102 and the third lead 103 of the semiconductor device A10. The configurations of the inner end surfaces 15 and the inner protrusions 19 of the first lead 101 and the fourth lead 104 are the same as this configuration.

A semiconductor device A12 that is a second variation of the semiconductor device A10 is described below based on FIG. 22. Note that FIG. 22 is a sectional view taken along the same plane as FIG. 11.

Figure 22:
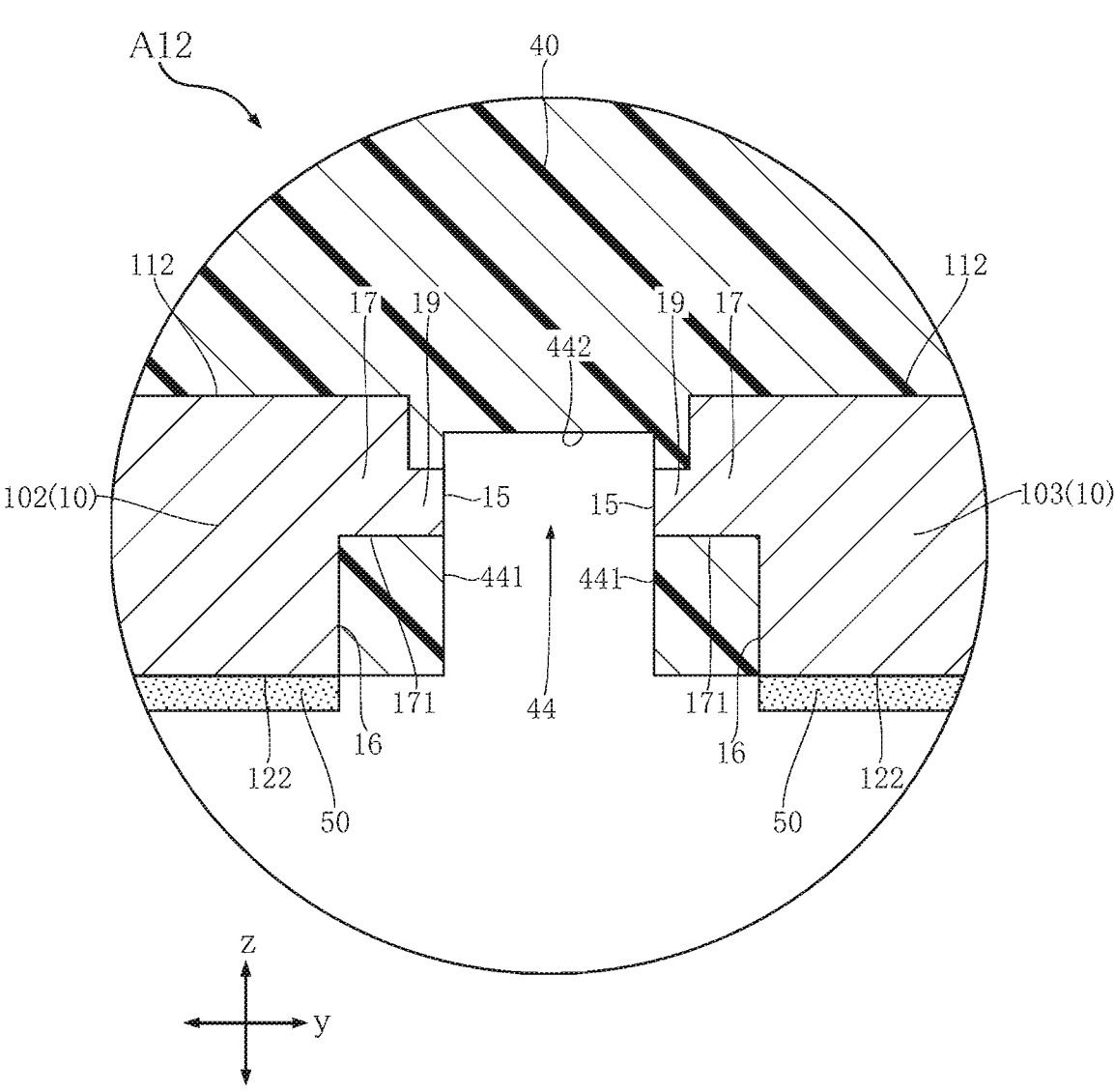
FIG. 22 is a partial enlarged sectional view of a second variation of the semiconductor device shown in FIG. 1.

As shown in FIG. 22, the semiconductor device A12 differs from the semiconductor device A10 in configurations of the inner end surfaces 15 and the inner protrusions 19 of the second lead 102 and the third lead 103 and in configuration of the recess 44 of the sealing resin 40. The upper surfaces of the inner protrusions 19, which face the same side as the obverse surfaces 112 in the thickness direction z, are offset from the obverse surfaces 112 toward the reverse surfaces 122 in the thickness direction z. The lower surfaces of the inner protrusions 19, which faces the same side as the reverse surfaces 122 in the thickness direction z, correspond to the overhang surfaces 171 of the eave portions 17. The inner end surfaces 15 are connected to the overhang surfaces 171. With such a configuration, the area of each inner end surface 15 is smaller than the area of the inner end surface 15 of each of the second lead 102 and the third lead 103 of the semiconductor device A10. The configurations of the inner end surfaces 15 and the inner protrusions 19 of the first lead 101 and the fourth lead 104 are the same as this configuration.

As shown in FIG. 22, in the thickness direction z, the intermediate surface 442 of the recess 44 is located between the obverse surfaces 112 and the reverse surfaces 122. Thus, the depth of the recess 44 is smaller than the depth of the recess 44 of the semiconductor device A10.

A semiconductor device A13 that is a third variation of the semiconductor device A10 is described below based on FIGS. 23 and 24. Note that FIGS. 23 and 24 are sectional views taken along the same plane as FIG. 11.

Figure 23:
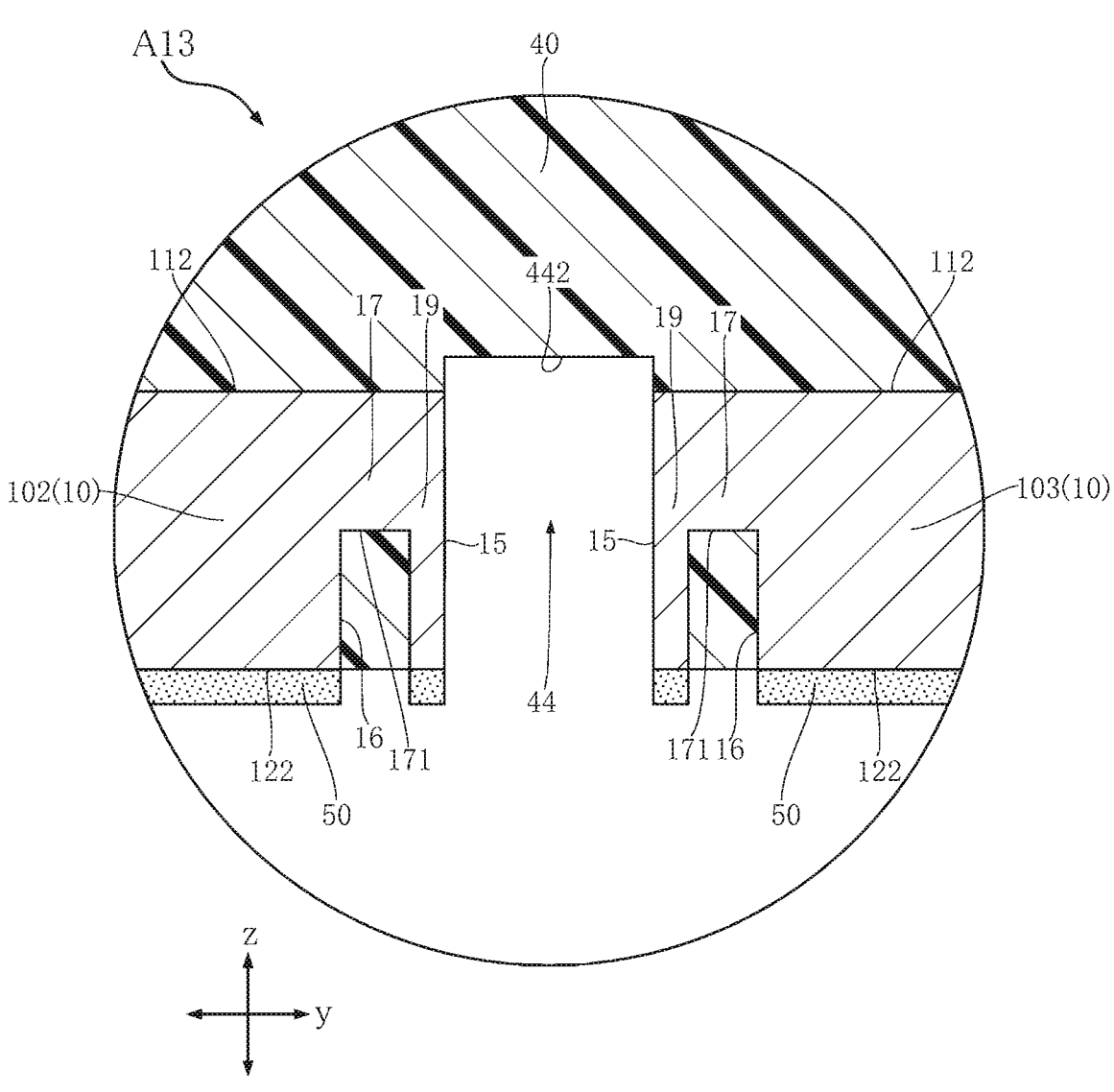
FIG. 23 is a partial enlarged sectional view of a third variation of the semiconductor device shown in FIG. 1.

As shown in FIG. 23, the semiconductor device A13 differs from the semiconductor device A10 in configurations of the inner end surfaces 15 and the inner protrusions 19 of the second lead 102 and the third lead 103. The lower surfaces of the inner protrusions 19, which faces the same side as the reverse surfaces 122 in the thickness direction z, are flush with reverse surfaces 122. The lower surfaces of the inner protrusions 19 are covered with the coating layer 50. The upper surfaces of the inner protrusions 19, which face the same side as the obverse surfaces 112 in the thickness direction z, correspond to the obverse surfaces 112. The inner end surfaces 15 are connected to the obverse surfaces 112.

Figure 24:
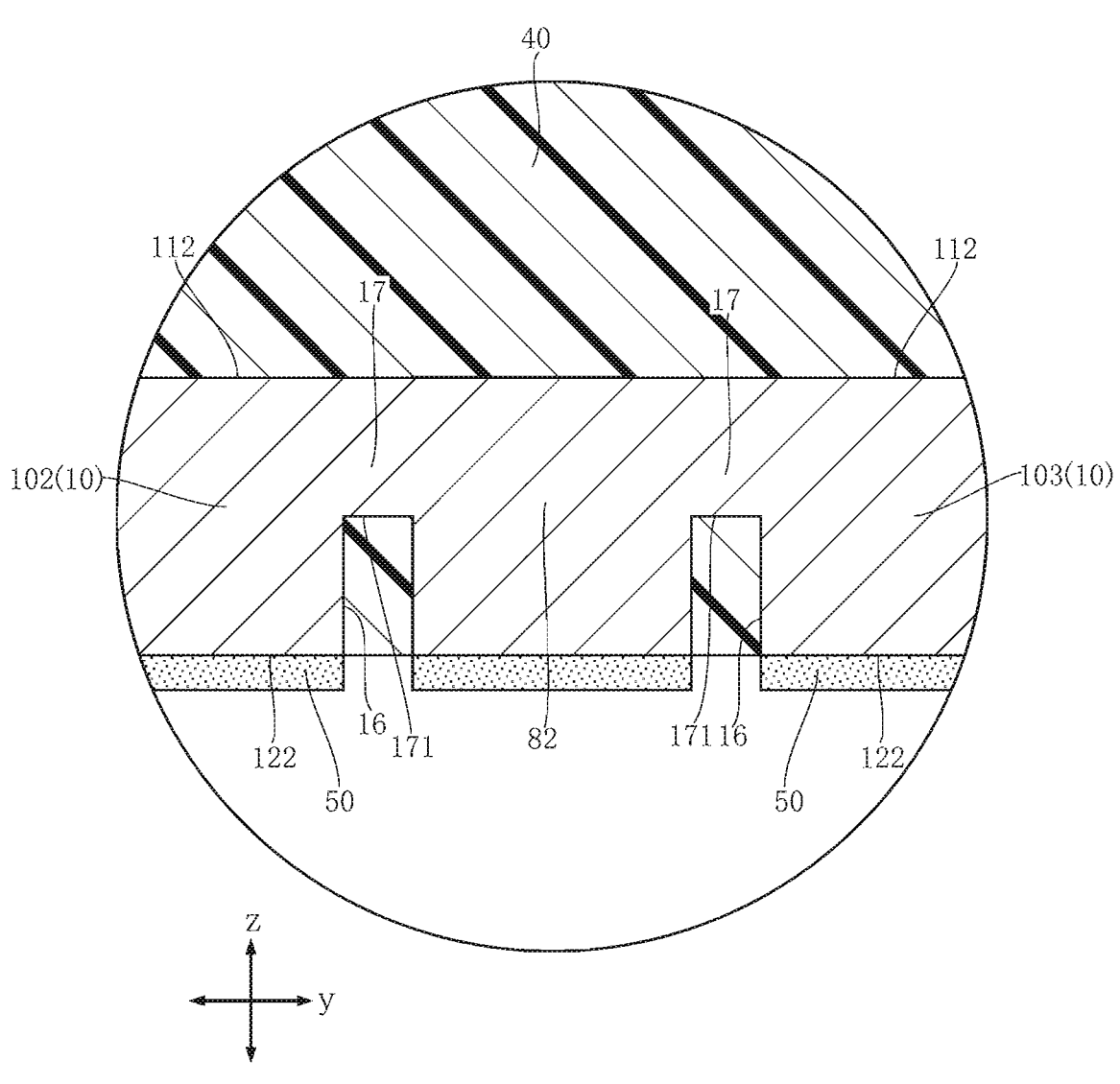
FIG. 24 is a partial enlarged sectional view for explaining a manufacturing step of the semiconductor device shown in FIG. 23.
Figure 25:
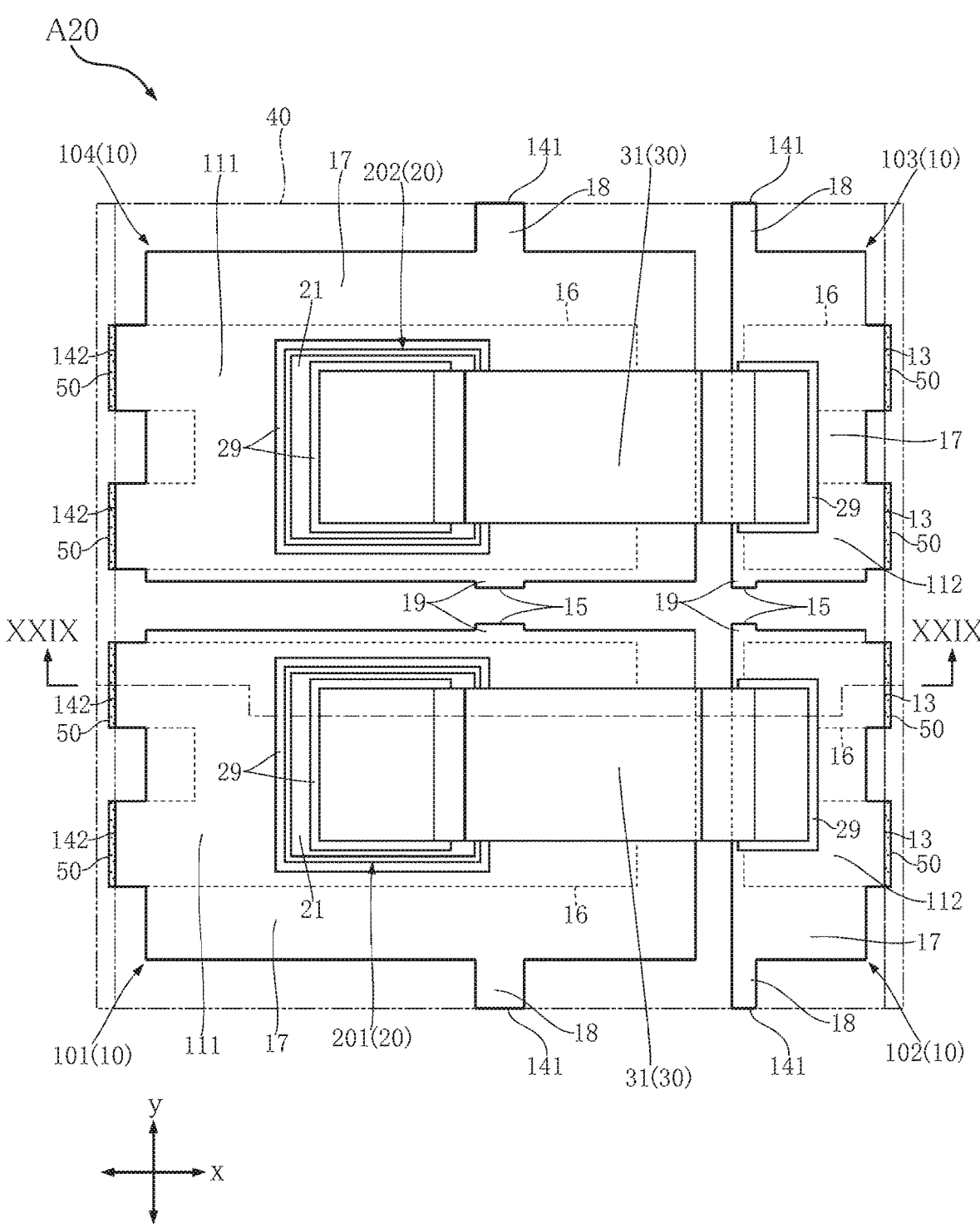
FIG. 25 is a plan view of a semiconductor device according to a second embodiment of the present disclosure, as seen through a sealing resin.

FIG. 24 shows a state before cutting the connecting strips 82 in the step of cutting the connecting strips 82 shown in FIG. 17 in the manufacturing process of the semiconductor device A13. The connecting strip 82 is connected to the eave portion 17 of the second lead 102 and the eave portion 17 of the third lead 103. The semiconductor device A13 is obtained by leaving opposite ends of the connecting strip 82 connected to the eave portions 17 in cutting the connecting strip 82. Therefore, the dimension of the long side (the dimension in the thickness direction z) of each inner end surface 15 is equal to the dimension of the long side of each of the two side surfaces 13 of the second lead 102 and each of the two side surfaces 13 of the third lead 103. Accordingly, the area of each inner end surface 15 is larger than the area of the inner end surface 15 of each of the second lead 102 and the third lead 103 of the semiconductor device A10. However, the dimension of the short side of each inner end surface 15 is smaller than the dimension of the short side of each of the two side surfaces 13. As a result, in the semiconductor device A13, the area of each inner end surface 15 is smaller than the area of each of the two side surfaces 13. The configurations of the inner end surfaces 15 and the inner protrusions 19 of the first lead 101 and the fourth lead 104 are the same as this configuration.

The effect and advantages of the semiconductor device A10 are described below.

The semiconductor device A10 includes the second lead 102 having the reverse surfaces 122 and the side surfaces 13 that are exposed from the sealing resin 40, and the coating layer 50 covering the reverse surfaces 122 and the side surfaces 13. The sealing resin 40 is formed with the recess 44 having the inner side surface 441 and recessed from the bottom surface 42. The second lead 102 and at least one of the first lead 101 and the third lead 103 located next to the second lead 102 with the recess 44 therebetween have the inner end surfaces 15 exposed at the inner side surface 441.

In the step of forming the sealing resin 40 shown in FIGS. 13 and 14 in the manufacturing process of the semiconductor device A10, the sealing resin 40 is formed such that the reverse surfaces 122 and the side surfaces 13 of the second lead 102 are exposed from the sealing resin 40. Thereafter, in the step of forming the coating layer 50 shown in FIGS. 15 and 16, the coating layer 50 can be formed by electrolytic plating. In the stage of this step, at least two leads 10 including the second lead 102 are connected to each other by a connecting strip 82 that has the same composition as the leads 10 and hence is electrically conductive. With such a configuration, a lead 10 that is not connected to the frame 80 by a tie bar 81 can also be electrically connected to the frame 80. By subsequently performing the step of cutting the connecting strip 82 shown in FIG. 17, electrical insulation is provided between the two leads 10 that have been connected to each other by a connecting strip 82. The inner end surfaces 15 and the recess 44 of the semiconductor device A10 are the traces obtained by this step. By subsequently performing the step of cutting the tie bar 81 shown in FIG. 20, all of the leads 10 are electrically insulated from each other.

Thus, in the semiconductor device A10, the coating layer 50 covering the reverse surfaces 122 and the side surfaces 13 of the second lead 102 can be easily formed by electrolytic plating. The semiconductor device A10 does not require the step of exposing the side surfaces 13 from the sealing resin 40 after the sealing resin 40 is formed. Furthermore, the formation efficiency of the coating layer 50 can be improved as compared with forming the coating layer 50 by electroless plating. Thus, the semiconductor device A10 and the manufacturing method makes it possible to efficiently form the coating layer 50 that covers the reverse surfaces 122 and the side surfaces 13 of the lead 10 (the second leads 102) exposed from the sealing resin 40.

The recess 44 of the sealing resin 40 is a groove extending in a direction orthogonal to the thickness direction z. The inner side surface 441 of the recess 44 includes a pair of regions that are spaced apart from each other in the direction that is orthogonal to the thickness direction z and the direction in which the recess 44 extends. The recess 44 having such a configuration is obtained by using a cutting apparatus such as a dicing blade in the step of cutting the connecting strips 82 shown in FIG. 17 in the manufacturing process of the semiconductor device A10. The use of such a cutting device allows efficient cutting of the connecting strips 82. As the bottom surface 42 of the sealing resin 40 is divided by the recess 44 into a plurality of regions, the connecting strips 82 can be cut smoothly without slowing down the cutting speed, whereby a decrease in the manufacturing efficiency of the semiconductor device A10 is prevented.

The inner end surface 15 of the second lead 102 is spaced apart from the side surfaces 13. Thus, in the step of cutting the connecting strips 82 shown in FIG. 17 in the manufacturing process of the semiconductor device A10, the portions of the coating layer 50 that cover the side surfaces 13 are prevented from being damaged by the cutting of the connecting strips 82.

The area of the inner end surface 15 of the second lead 102 is smaller than the area of each side surface 13. Thus, in the step of cutting the connecting strips 82 shown in FIG. 17 in the manufacturing process of the semiconductor device A10, generation of metal burrs on the edges of the inner end surface 15 can be reduced. Moreover, the inner end surface 15 is spaced apart from the reverse surfaces 122. Thus, when the semiconductor device A10 is mounted on a wiring board, the bonding strength of the semiconductor device A10 to the wiring board is not reduced by such metal burrs.

The inner end surface 15 of the second lead 102 is connected to the obverse surface 112. In this configuration, it is preferable that the intermediate surface 442 of the recess 44 of the sealing resin 40 is farther away from the bottom surface 42 of the sealing resin 40 than is the obverse surface 112. With such a configuration, in the step of cutting the connecting strips 82 shown in FIG. 17 in the manufacturing process of the semiconductor device A10, the connecting strips 82 can be cut reliably.

The first lead 101 has the first outer end surface 141, which faces in a direction different from the direction in which the side surfaces 13 of the second lead 102 face and is exposed at the outer side surface 43 of the sealing resin 40. The first outer end surface 141 is a trace of cutting the tie bars 81 shown in FIG. 20 in the manufacturing process of the semiconductor device A10. The cutting of the tie bars 81 in this step does not damage the portions of the coating layer 50 that cover the side surfaces 13.

The first outer end surface 141 of the first lead 101 is spaced apart from the mounting surface 121. In the step of cutting the tie bars 81 shown in FIG. 20 in the manufacturing process of the semiconductor device A10, metal burrs are generated at the edges of the first outer end surface 141. According to the present configuration, when the semiconductor device A10 is mounted on a wiring board, the bonding strength of the semiconductor device A10 to the wiring board is not reduced by such metal burrs.

The first lead 101 has second outer end surfaces 142 connected to the mounting surface 121 and exposed at the outer side surface 43 of the sealing resin 40. In the step of forming the coating layer 50 shown in FIGS. 15 and 16 in the manufacturing process of the semiconductor device A10, the coating layer 50 covering the mounting surface 121 and the second outer end surfaces 142 can be easily formed by electrolytic plating as long as the first lead 101 has at least the first outer end surface 141. When the semiconductor device A10 is mounted on a wiring board, the state of bonding on the wiring substrate can be easily checked visually not only at the second lead 102 but also at the first lead 101.

The area of the mounting surface 121 of the first lead 101 is larger than the area of the reverse surfaces 122 of the second lead 102. The first semiconductor element 201 is mounted on the first lead 101. Thus, the heat generated from the first semiconductor element 201 is efficiently dissipated to the outside.

The semiconductor device A10 further includes the fourth lead 104 on which the second semiconductor element 202 is mounted. The recess 44 of the sealing resin 40 is also located between the first lead 101 and fourth lead 104. Each of the first lead 101 and the fourth lead 104 has the inner end surface 15 exposed at the inner side surface 441 of the recess 44. Thus, in the step of forming the coating layer 50 shown in FIGS. 15 and 16 in the manufacturing process of the semiconductor device A10, the coating layer 50 covering the mounting surface 121 and the second outer end surfaces 142 can be easily formed by electrolytic plating not only for the first lead 101 but also for the fourth lead 104.

In the semiconductor device A11 and the semiconductor device A12, the area of the inner end surface 15 of the second lead 102 is smaller than the area of the inner end surface 15 of the second lead 102 of the semiconductor device A10. Thus, in the step of cutting the connecting strips 82 shown in FIG. 17 in the manufacturing process of the semiconductor device A10, generation of metal burrs on the edges of the inner end surface 15 can be reduced. Moreover, in the semiconductor device A12, the depth of the recess 44 of the sealing resin 40 is smaller than the depth of the recess 44 of the semiconductor device A10. Such a configuration reduces the volume of the sealing resin 40 that needs to be removed in the step of cutting the connecting strips 82 shown in FIG. 17 in the manufacturing process of the semiconductor device A10. This contributes to prevention of a decrease in the strength of the sealing resin 40.

A semiconductor device A20 according to a second embodiment of the present disclosure is described below based on FIGS. 25 to 30. In these figures, the elements that are identical or similar to those of the semiconductor device A10 described above are denoted by the same reference signs as those used for the semiconductor device A10, and descriptions thereof are omitted. For convenience of understanding, the sealing resin 40 is transparent and indicated by imaginary lines in FIG. 25.

The semiconductor device A20 differs from the semiconductor device A10 described above in configurations of the leads 10 and the sealing resin 40.

Figure 26:
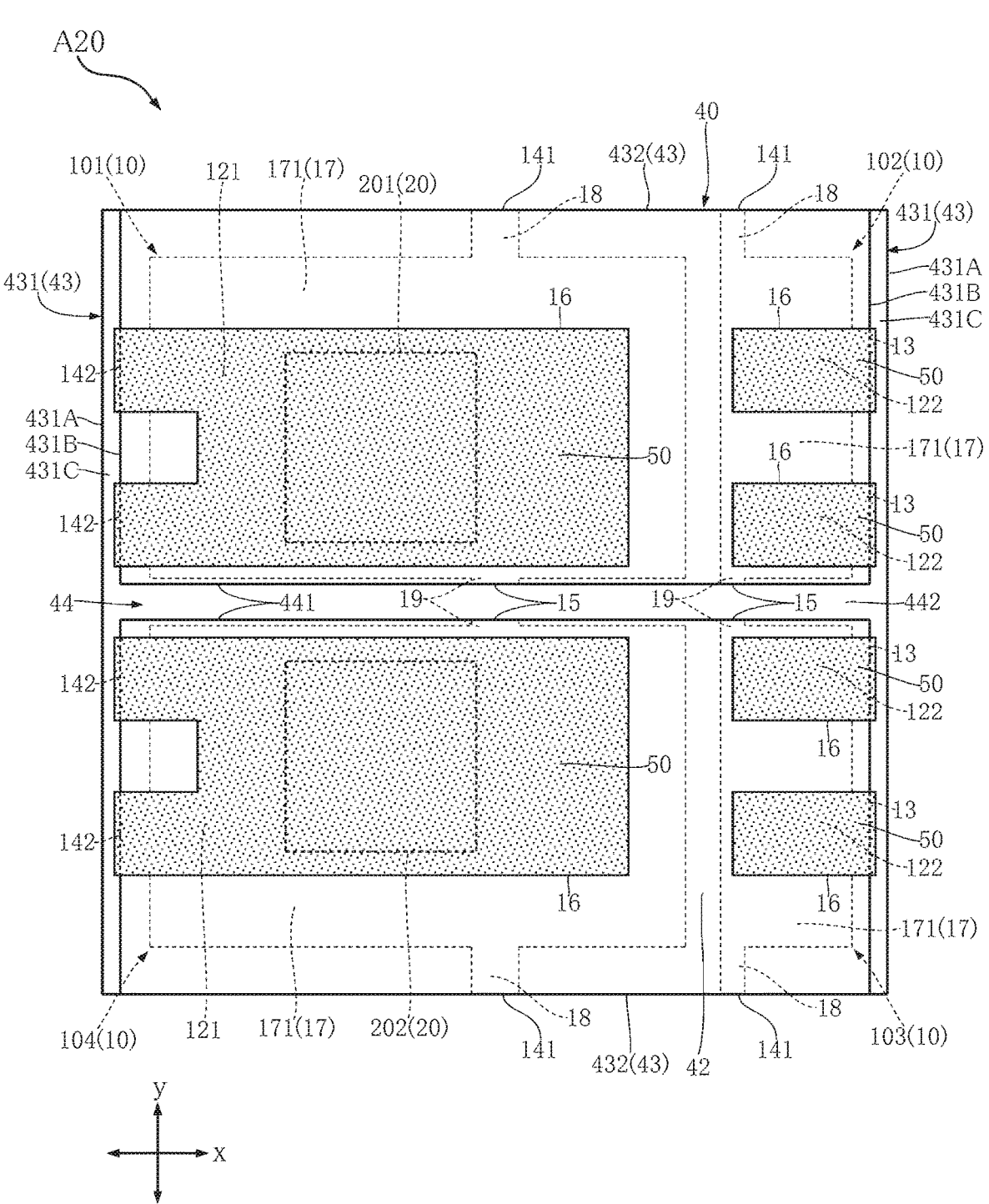
FIG. 26 is a bottom view of the semiconductor device shown in FIG. 25.
Figure 27:
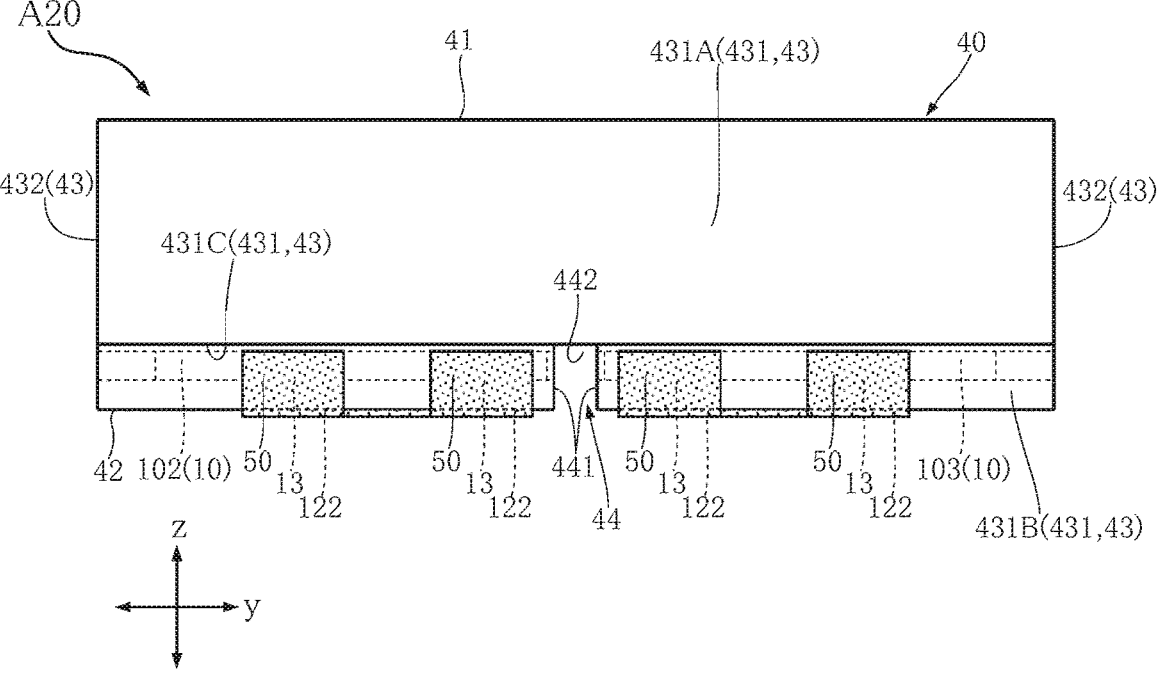
FIG. 27 is a right side view of the semiconductor device shown in FIG. 25.
Figure 28:
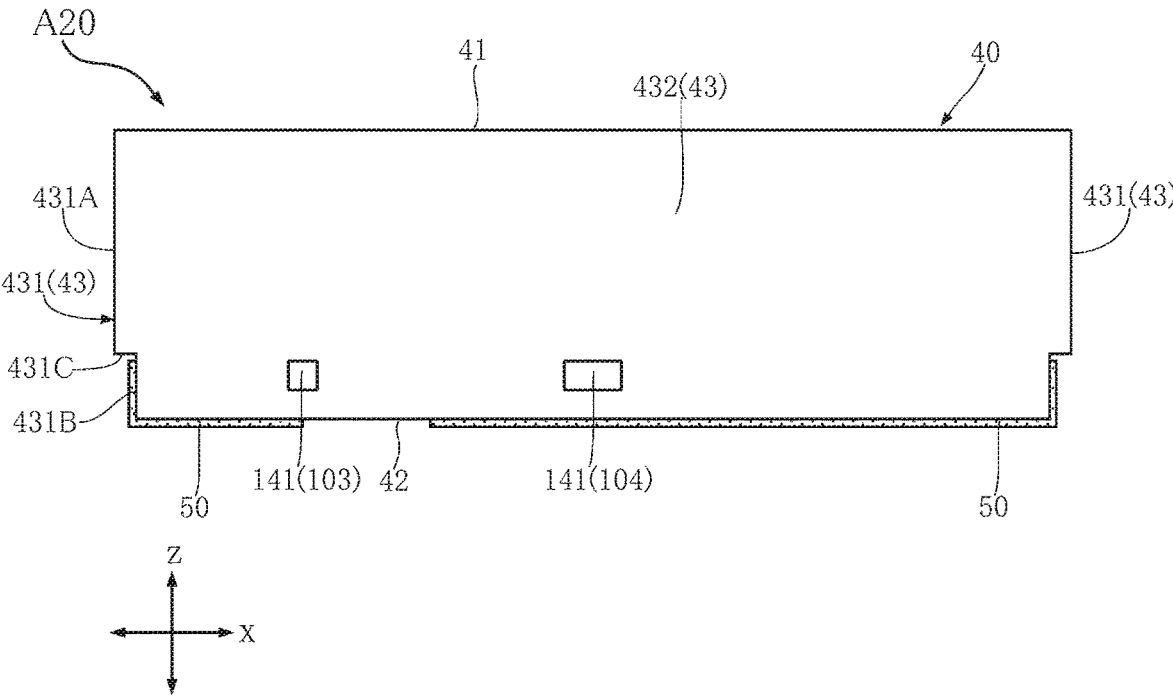
FIG. 28 is a rear view of the semiconductor device shown in FIG. 25.

As shown in FIGS. 26 to 28, each of the pair of first surfaces 431 of the outer side surface 43 of the sealing resin 40 includes a first region 431A, a second region 431B and a third region 431C. The first region 431A is connected to the top surface 41 of the sealing resin 40. The second region 431B is connected to the bottom surface 42 of the sealing resin 40 and located inward from the first region 431A. The two side surfaces 13 of each of the second lead 102 and the third lead 103 are exposed at the second region 431B of one of the pair of first surfaces 431. The two second outer end surfaces 142 of each of the first lead 101 and the fourth lead 104 are exposed at the second region 431B of the other of the pair of first surfaces 431. The third region 431C is located between the top surface 41 and the bottom surface 42 in the thickness direction z and connected to the first region 431A and the second region 431B. The third region 431C faces the same side as the bottom surface 42 in the thickness direction z.

Figure 29:
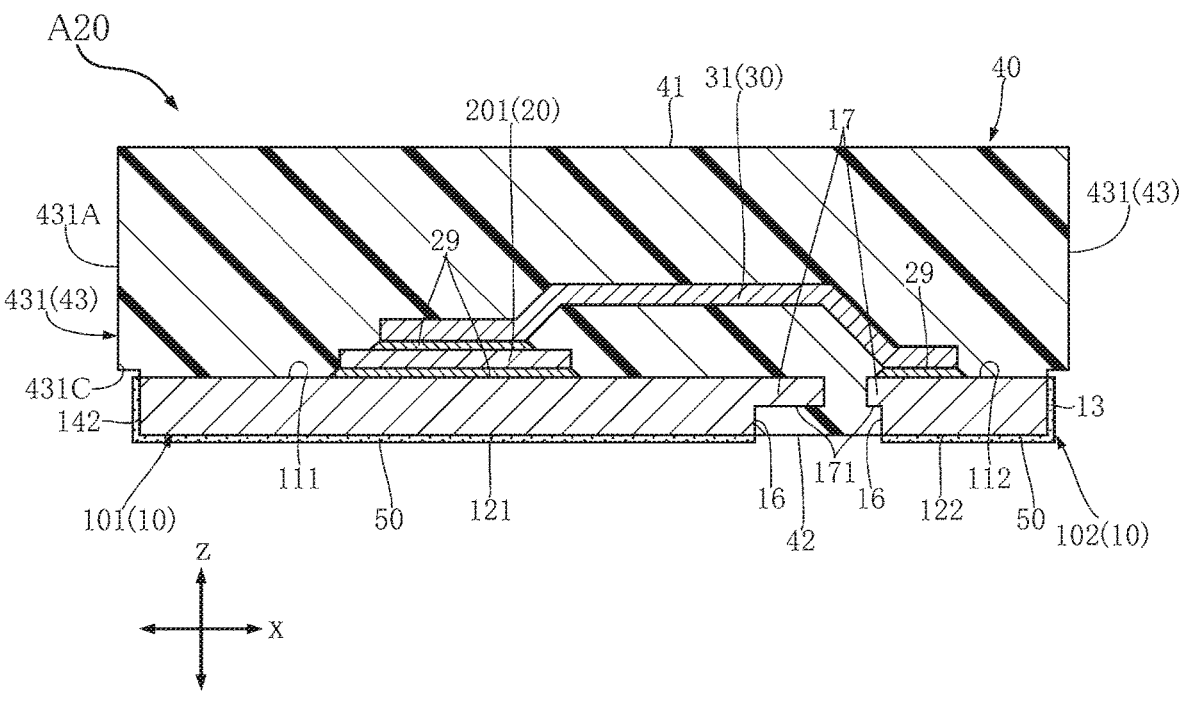
FIG. 29 is a sectional view taken along line XXIX-XXIX in FIG. 25.
Figure 30:
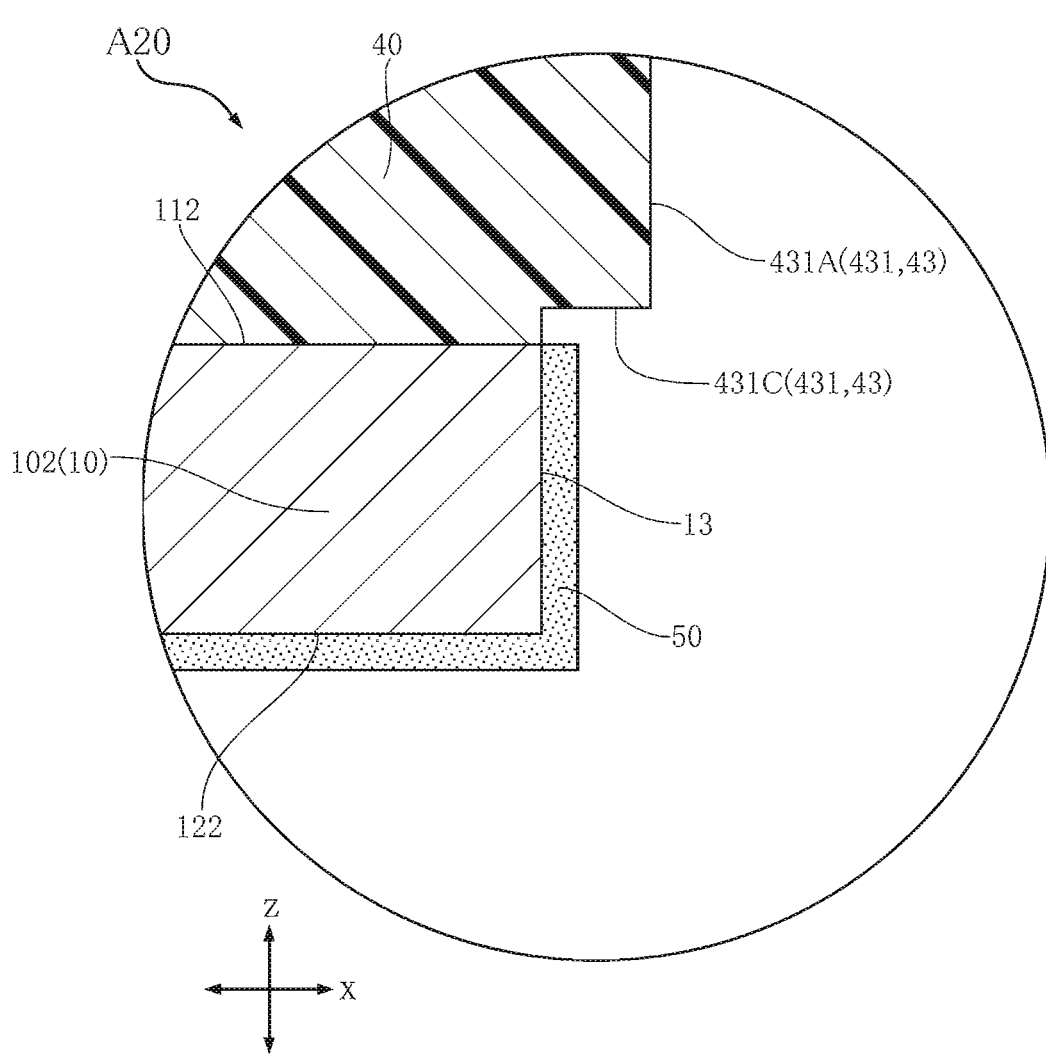
FIG. 30 is a partially enlarged view of FIG. 29.

As shown in FIGS. 29 and 30, the coating layer 50 is located on the inner side of the sealing resin 40 relative to the first regions 431A of the pair of first surfaces 431 of the outer side surface 43. As shown in FIG. 26, as viewed in the thickness direction z, the third regions 431C of the pair of first surfaces 431 overlap with the coating layer 50. In the thickness direction z, the third regions 431C are located closer to the top surface 41 than are the obverse surfaces 112 of the second lead 102 and the third lead 103.

Figures 34, 35:
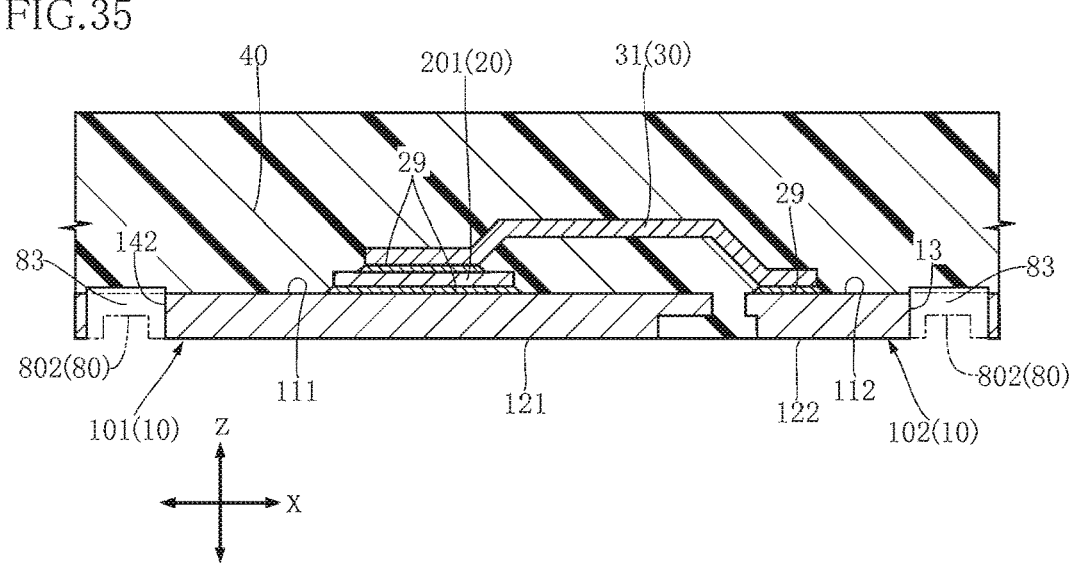
FIG. 34 is a bottom view for explaining a manufacturing step of the semiconductor device shown in FIG. 25.
FIG. 35 is a sectional view for explaining a manufacturing step of the semiconductor device shown in FIG. 25.
Figures 36, 37:
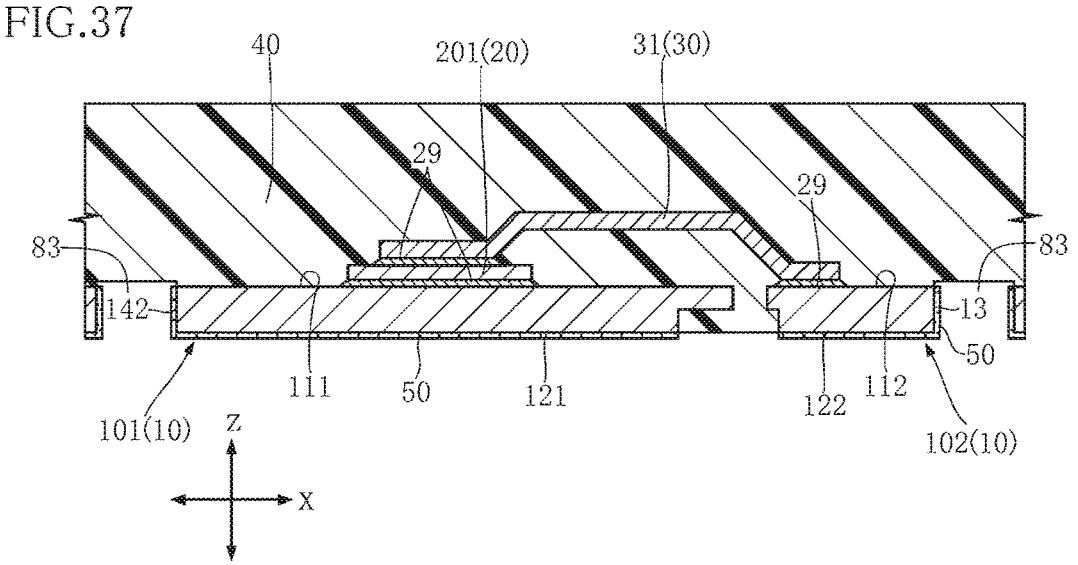
FIG. 36 is a bottom view for explaining a manufacturing step of the semiconductor device shown in FIG. 25.
FIG. 37 is a sectional view for explaining a manufacturing step of the semiconductor device shown in FIG. 25.

An example of a method for manufacturing the semiconductor device A20 is described below based on FIGS. 31 to 37. Note that FIGS. 33, 35 and 37 are sectional views taken along the same plane as FIG. 29.

Figure 31:
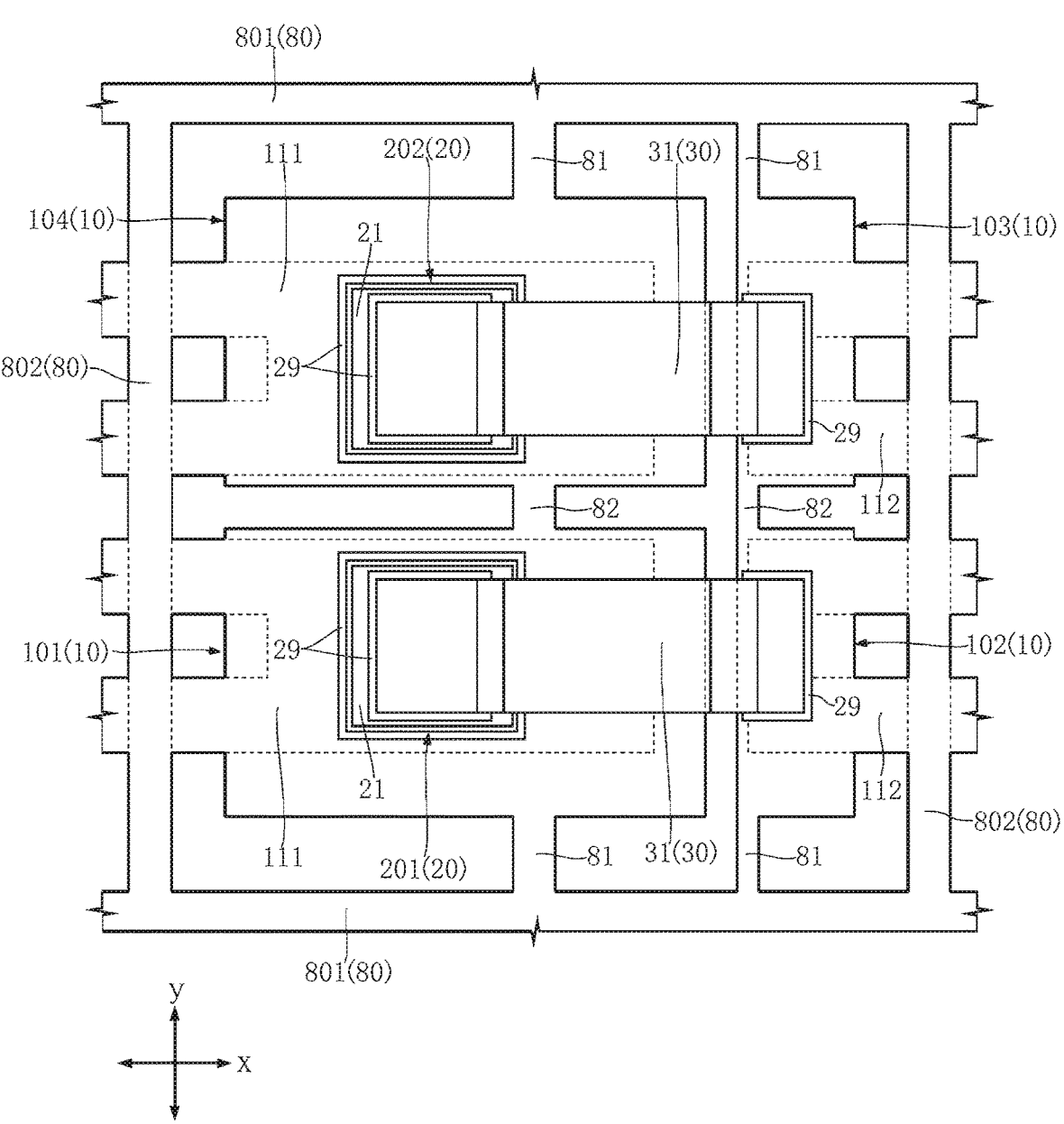
FIG. 31 is a plan view for explaining a manufacturing step of the semiconductor device shown in FIG. 25.

First, as shown in FIG. 31, semiconductor elements 20 are mounted on the element-mounting surfaces 111 of the first lead 101 and the fourth lead 104 of the plurality of leads 10. Thereafter, a conducting member 30 is bonded to the first electrode 21 of one of the semiconductor elements 20 and the obverse surface 112 of the second lead 102, and another conducting member 30 is bonded to the first electrode 21 of the other semiconductor element 20 and the obverse surface 112 of the third lead 103.

As shown in FIG. 31, the frame 80 includes a plurality of first frame portions 801 and a plurality of second frame portions 802. The first frame portions 801 extend along the first direction x and are spaced apart from each other in the second direction y. The second frame portions 802 extend along the second direction y and are spaced apart from each other in the first direction x. Opposite ends of each of the second frame portions 802 are connected to two first frame portions 801 adjacent to each other in the second direction y. Tie bars 81 are connected to the first frame portions 801. In the semiconductor device A20, each of the leads 10 is connected to one of two second frame portions 802 adjacent to each other in the first direction x.

Figures 32, 33:
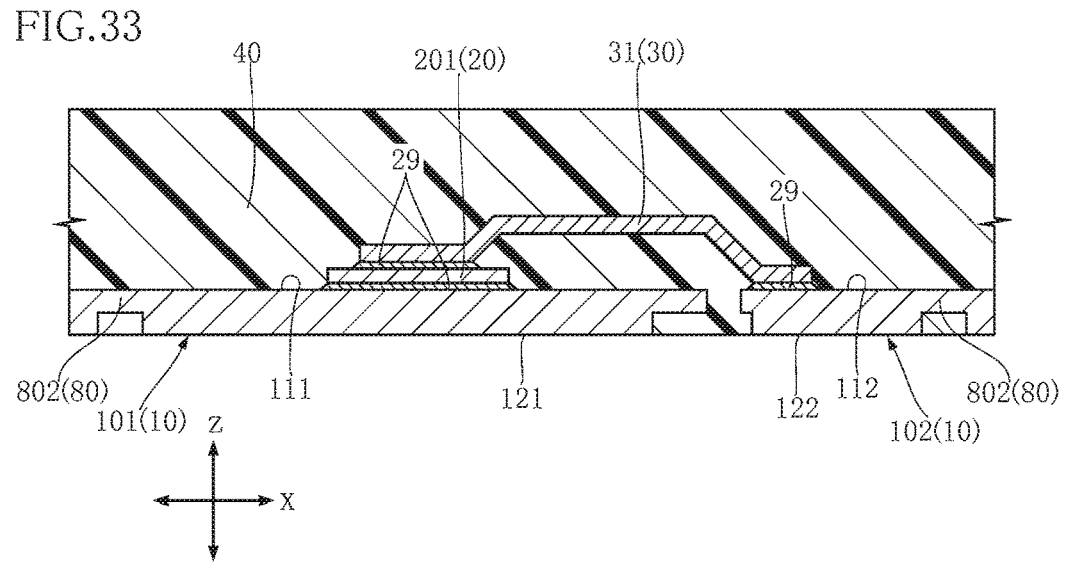
FIG. 32 is a plan view for explaining a manufacturing step of the semiconductor device shown in FIG. 25.
FIG. 33 is a sectional view for explaining a manufacturing step of the semiconductor device shown in FIG. 25.

Next, as shown in FIGS. 32 to 33, the sealing resin 40 covering a part of each lead 10, the semiconductor elements 20, and the conducting members 30 is formed. The sealing resin 40 is formed over the entirety of the frame 80 by compression molding. In this step, the reverse surface 122 of at least one of the leads 10 (the second lead 102 and the third lead 103) is exposed from the sealing resin 40. In this step, the mounting surfaces 121 of the first lead 101 and the fourth lead 104 are also exposed from the sealing resin 40.

Next, as shown in FIGS. 34 and 35, the second frame portions 802 are removed from the side on which the reverse surfaces 122 are exposed in the thickness direction z. The removal of the second frame portions 802 is performed by half-cut dicing. In this step, portions of the leads 10 located at the boundary with the second frame sections 802 and portions of the sealing resin 40 located at the boundary with the second frame sections 802 are removed together. Through this step, a plurality of grooves 83 recessed in the thickness direction z and extending in the second direction y are formed in the sealing resin 40. Two side surfaces 13 of each of the second lead 102 and the third lead 103 and two second outer end surfaces 142 of each of the first lead 101 and the fourth lead 104 emerge from two grooves 83 adjacent to each other in the first direction x.

Next, as shown in FIGS. 36 and 37, the coating layer 50 covering the reverse surfaces 122 and the side surfaces 13 exposed from the sealing resin 40 is formed by electrolytic plating. In this step, the mounting surface 121 and the two second outer end surfaces 142 of each of the first lead 101 and the fourth lead 104 are also covered with the coating layer 50. Next, the connecting strips 82 are cut by removing a part of the sealing resin 40 from the side on which the reverse surfaces 122 are exposed in the thickness direction z. The technique to cut the connecting strips 82 is the same as the cutting technique in the manufacturing process of semiconductor device A10 shown in FIGS. 17 to 19.

Finally, the leads 10 are separated from the frame 80 by cutting the sealing resin 40 and the tie bars 81 in a grid pattern along the first direction x and second direction y. Through the steps described above, the semiconductor device A20 is obtained.

The effect and advantages of the semiconductor device A20 are described below.

The semiconductor device A20 includes the second lead 102 having the reverse surfaces 122 and the side surfaces 13 that are exposed from the sealing resin 40, and the coating layer 50 covering the reverse surfaces 122 and the side surfaces 13. The sealing resin 40 is formed with the recess 44 having the inner side surface 441 and recessed from the bottom surface 42. The second lead 102 and at least one of the first lead 101 and the third lead 103 located next to the second lead 102 with the recess 44 therebetween have the inner end surfaces 15 exposed at the inner side surface 441. Thus, the semiconductor device A20 also makes it possible to efficiently form the coating layer 50 that covers the reverse surfaces 122 and the side surfaces 13 of the lead 10 (the second leads 102) exposed from the sealing resin 40. Moreover, the semiconductor device A20 has a configuration similar to that of semiconductor device A10, and hence has the same advantages as the semiconductor device A10.

In the semiconductor device A20, each of the pair of first surfaces 431 of the outer side surface 43 of the sealing resin 40 includes a first region 431A, a second region 431B and a third region 431C. Such a configuration is obtained by removing the second frame portions 802 after the formation of the sealing resin 40 in the manufacturing process of the semiconductor device A20. Before the second frame portions 802 are removed, each of the leads 10 is connected to one of the second frame portions 802. This makes it possible to form the sealing resin 40 over the entire frame 80 by compression molding. Thus, formation of the sealing resin 40 is easier than in the case of the semiconductor device A10.

Figure 38:
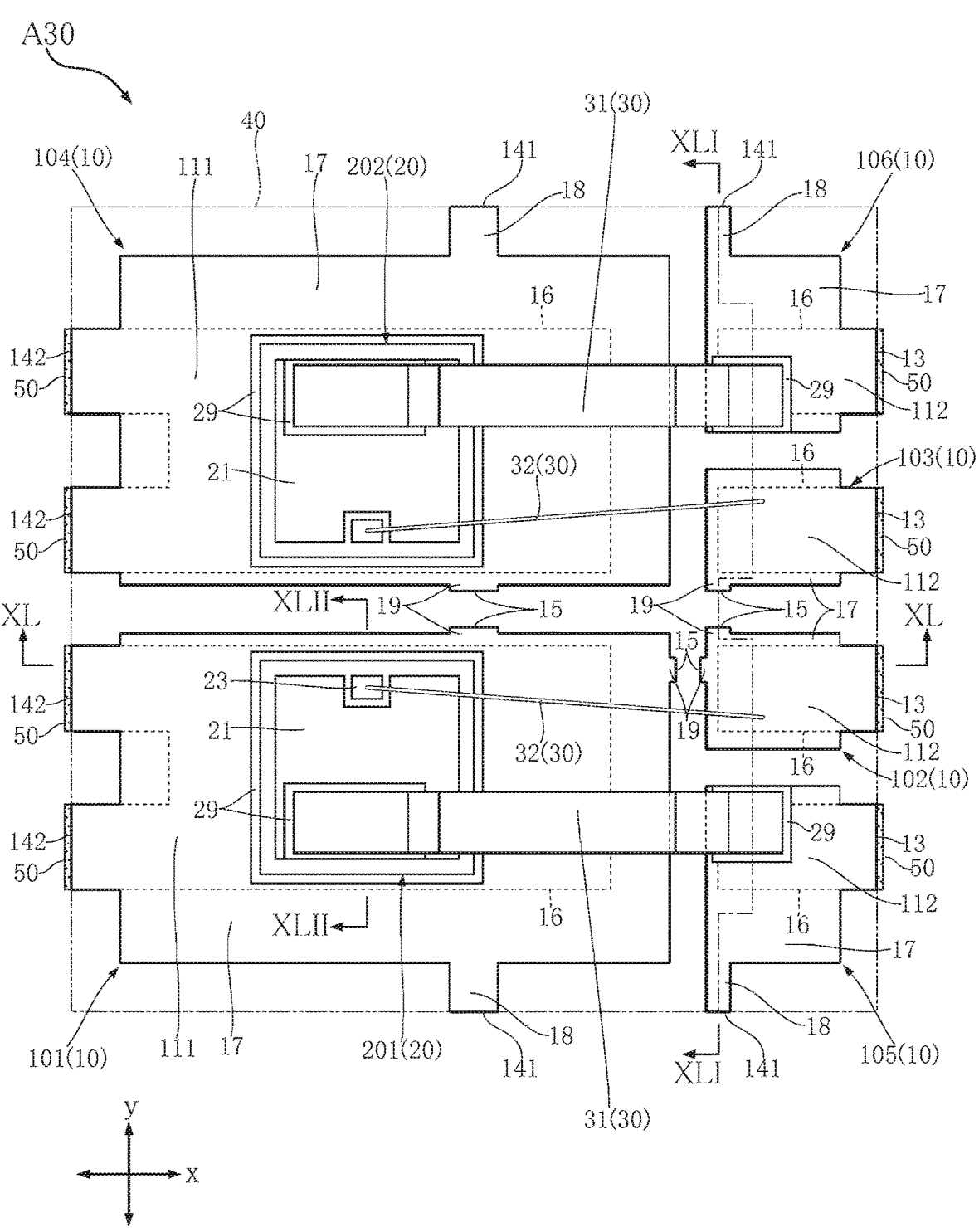
FIG. 38 is a plan view of a semiconductor device according to a third embodiment of the present disclosure, as seen through a sealing resin.

A semiconductor device A30 according to a third embodiment of the present disclosure is described below based on FIGS. 38 to 43. In these figures, the elements that are identical or similar to those of the semiconductor device A10 described above are denoted by the same reference signs as those used for the semiconductor device A10, and descriptions thereof are omitted. For convenience of understanding, the sealing resin 40 is transparent in FIG. 38. In FIG. 38, the sealing resin 40 is indicated by imaginary lines.

The semiconductor device A30 differs from the semiconductor device A10 described above in configurations of the leads 10, the semiconductor elements 20, the conducting members 30 and the sealing resin 40.

Figure 39:
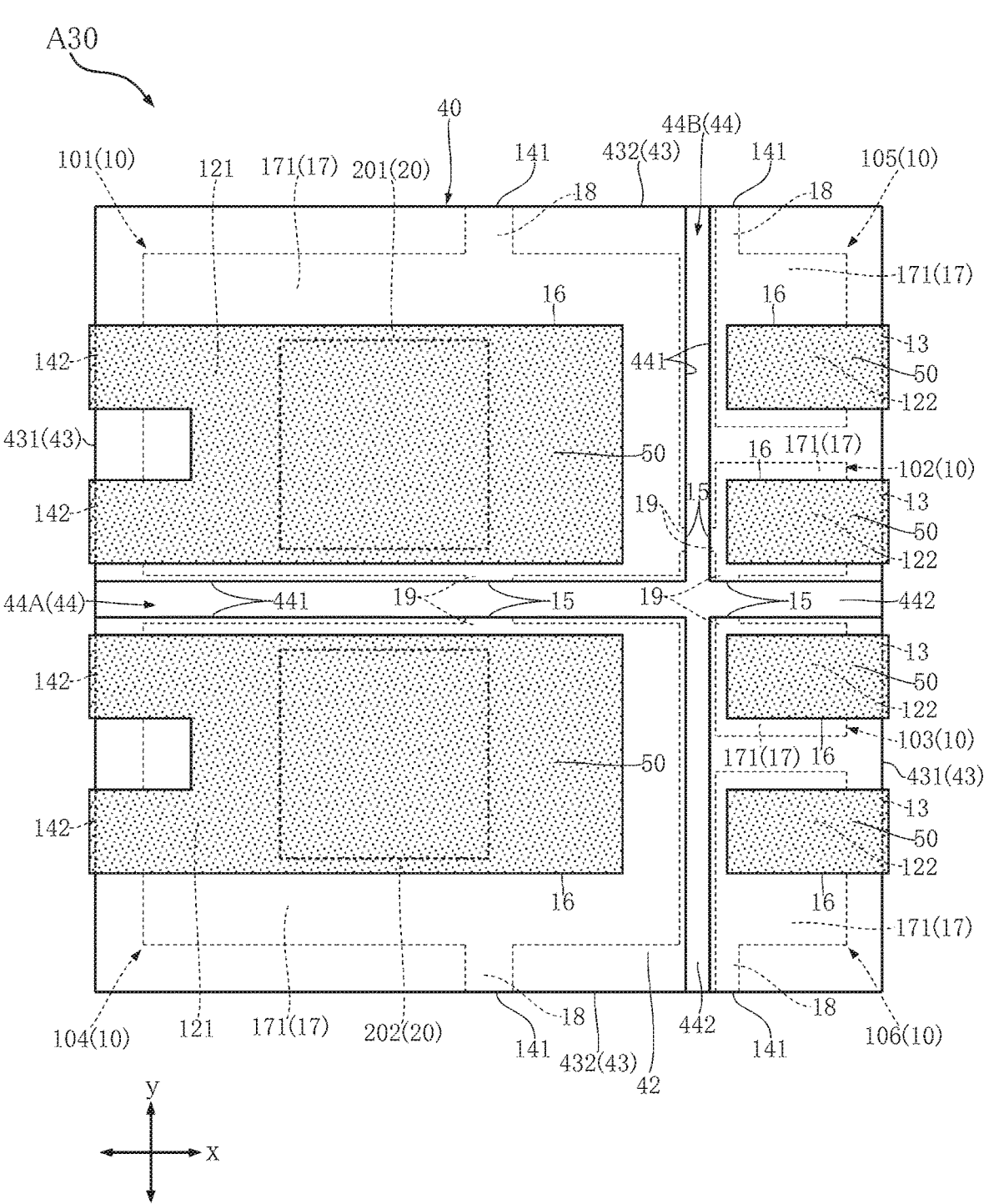
FIG. 39 is a bottom view of the semiconductor device shown in FIG. 38.

As shown in FIGS. 38 and 39, the plurality of leads 10 include a fifth lead 105 and a sixth lead 106 in addition to the first lead 101, the second lead 102, the third lead 103 and the fourth lead 104. The fifth lead 105 is located next to the second lead 102 in the second direction y and located on the opposite side of the third lead 103 relative to the second lead 102 in the second direction y. The sixth lead 106 is located next to the third lead 103 in the second direction y and located on the opposite side of the second lead 102 relative to the third lead 103 in the second direction y.

Figure 41:
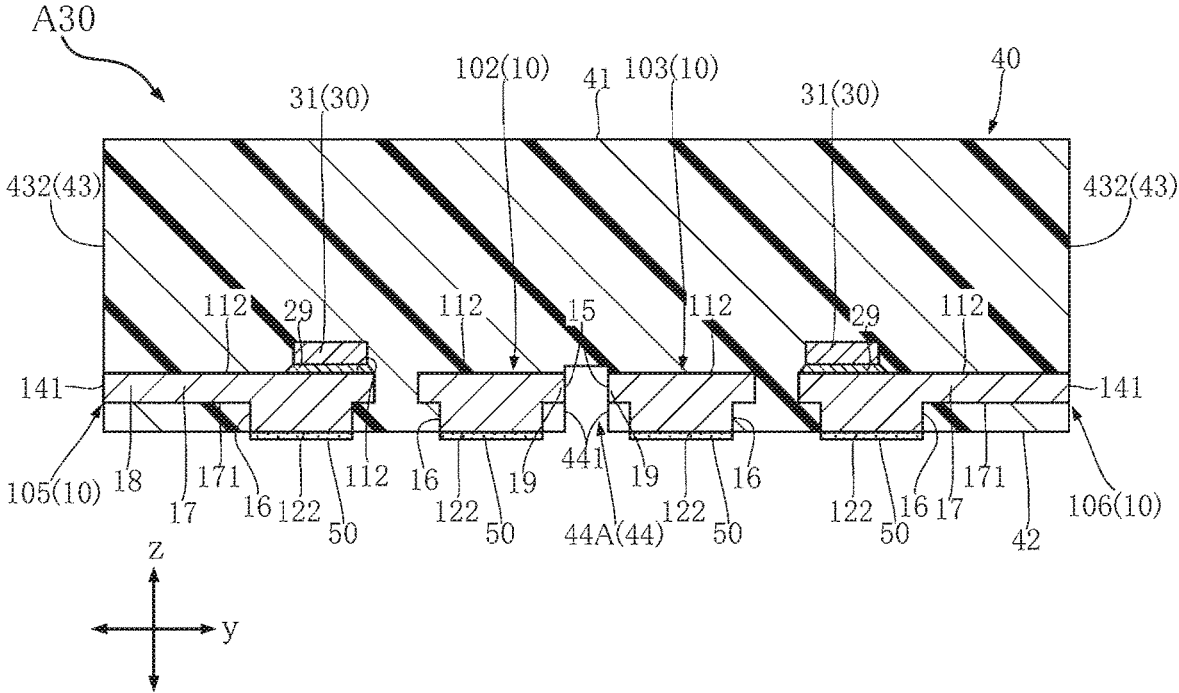
FIG. 41 is a sectional view taken along line XLI-XLI in FIG. 38.

As shown in FIGS. 38, 39 and 41, each of the fifth lead 105 and the sixth lead 106 has an obverse surface 112, a reverse surface 122, a side surface 13, a first outer end surface 141, an inner peripheral surface 16, an eave portion 17 and an outer protrusion 18.

As shown in FIGS. 38 and 39, each of the second lead 102 and the third lead 103 has an obverse surface 112, a reverse surface 122, a side surface 13, an inner end surface 15, an inner peripheral surface 16, an eave portion 17 and an inner protrusion 19. The inner end surface 15 of the second lead 102 includes a region facing inward in the sealing resin 40 in the first direction x and a region facing inward in the sealing resin 40 in the second direction y. Accordingly, the inner protrusion 19 of the second lead 102 includes a region protruding from the eave portion 17 inward in the first direction x in the sealing resin 40 and a region protruding from the eave portion 17 inward in the second direction y in the sealing resin 40.

As shown in FIGS. 38 and 39, the first lead 101 has an element-mounting surface 111, a mounting surface 121, a first outer end surface 141, two second outer end surfaces 142, an inner end surface 15, an inner peripheral surface 16, an eave portion 17, an outer protrusion 18 and an inner protrusion 19. The inner end surface 15 of the first lead 101 includes a region facing inward in the sealing resin 40 in the first direction x and a region facing inward in the sealing resin 40 in the second direction y. Accordingly, the inner protrusion 19 of the first lead 101 includes a region protruding from the eave portion 17 inward in the first direction x in the sealing resin 40 and a region protruding from the eave portion 17 inward in the second direction y in the sealing resin 40. The configuration of the fourth lead 104 is the same as that of the fourth lead 104 of the semiconductor device A10, and the description thereof is omitted.

In the semiconductor device A30, the semiconductor elements 20 are n-channel MOSFETs (Metal-Oxide-Semiconductor Field-Effect Transistors) of a vertical structure type. The semiconductor elements 20 include compound semiconductor substrates. The main material of the compound semiconductor substrates is silicon carbide (SiC). Alternatively, silicon (Si) may be used as the main material of the compound semiconductor substrates. The semiconductor elements 20 may be other switching elements such as IGBTs (Insulated Gate Bipolar Transistors). In the semiconductor device A30 again, the semiconductor elements 20 include a first semiconductor element 201 and a second semiconductor element 202.

As shown in FIG. 42, each of the semiconductor elements 20 has a first electrode 21, a second electrode 22, and a gate electrode 23. The first electrodes 21 is provided on a surface that faces the same side as the element-mounting surface 111 of the first lead 101. A current corresponding to the power after conversion by the semiconductor element 20 flows in the first electrode 21. That is, the first electrode 21 corresponds to a source electrode.

As shown in FIG. 42, the second electrode 22 is disposed on the opposite side of the first electrode 21 in the thickness direction z. The second electrode 22 faces the element-mounting surface 111 of the first lead 101 or the element-mounting surface 111 of the fourth lead 104. A current corresponding to the power before conversion by the semiconductor element 20 flows in the second electrode 22. That is, the second electrode 22 corresponds to a drain electrode.

As shown in FIG. 42, the gate electrode 23 is provided on the same side as the first electrode 21 in the thickness direction z and spaced apart from the first electrode 21. A gate voltage for driving the semiconductor element 20 is applied to the gate electrode 23. As shown in FIG. 38, as viewed in the thickness direction z, the area of the gate electrode 23 is smaller than the area of the first electrode 21.

As shown in FIG. 38, the plurality of conducting members 30 include two first members 31 and two second members 32. One of the two first members 31 is bonded to the first electrode 21 of the first semiconductor element 201 and the obverse surface 112 of the fifth lead 105 via bonding layers 29. Thus, the first electrode 21 of the first semiconductor element 201 is electrically connected to the fifth lead 105. The other of the first members 31 is bonded to the first electrode 21 of the second semiconductor element 202 and the obverse surface 112 of the sixth lead 106 via bonding layers 29. Thus, the first electrode 21 of the second semiconductor element 202 is electrically connected to the sixth lead 106.

As shown in FIG. 38, one of the two second members 32 is bonded to the gate electrode 23 of the first semiconductor element 201 and the obverse surface 112 of the second lead 102. Thus, the gate electrode 23 of the first semiconductor element 201 is electrically connected to the second lead 102. The other of the two second members 32 is bonded to the gate electrode 23 of the second semiconductor element 202 and the obverse surface 112 of the third lead 103. Thus, the gate electrode 23 of the second semiconductor element 202 is electrically connected to the third lead 103. The two second members 32 are wires. The composition of the two second members 32 includes gold. Alternatively, the composition of the two second members 32 may include aluminum (Al) or copper.

As shown in FIG. 38, as viewed in the thickness direction z, the conducting members 30 are spaced apart from the inner end surfaces 15 of the leads 10 (the first lead 101, the second lead 102 and the third lead 103).

Figure 40:
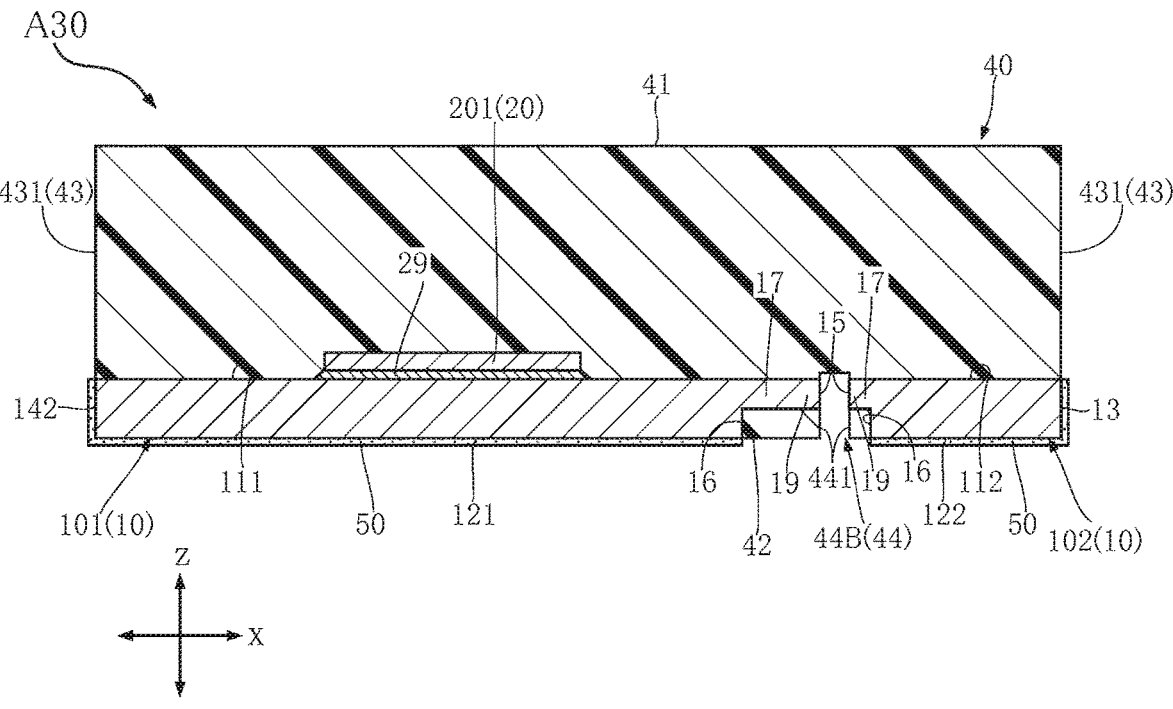
FIG. 40 is a sectional view taken along line XL-XL in FIG. 38.

As shown in FIGS. 39 to 41, the recess 44 of the sealing resin 40 includes a first groove 44A and a second groove 44B. The first groove 44A extends in the first direction x. Opposite ends of the first groove 44A in the first direction x are connected to the pair of first surfaces 431 of the outer side surface 43. The second groove 44B extends in the second direction y. Opposite ends of the second groove 44B in the second direction y are connected to the pair of second surfaces 432 of the outer side surface 43. The second groove 44B crosses the first groove 44A. The bottom surface 42 of the sealing resin 40 is divided by the recess 44 into four regions.

Figure 43:
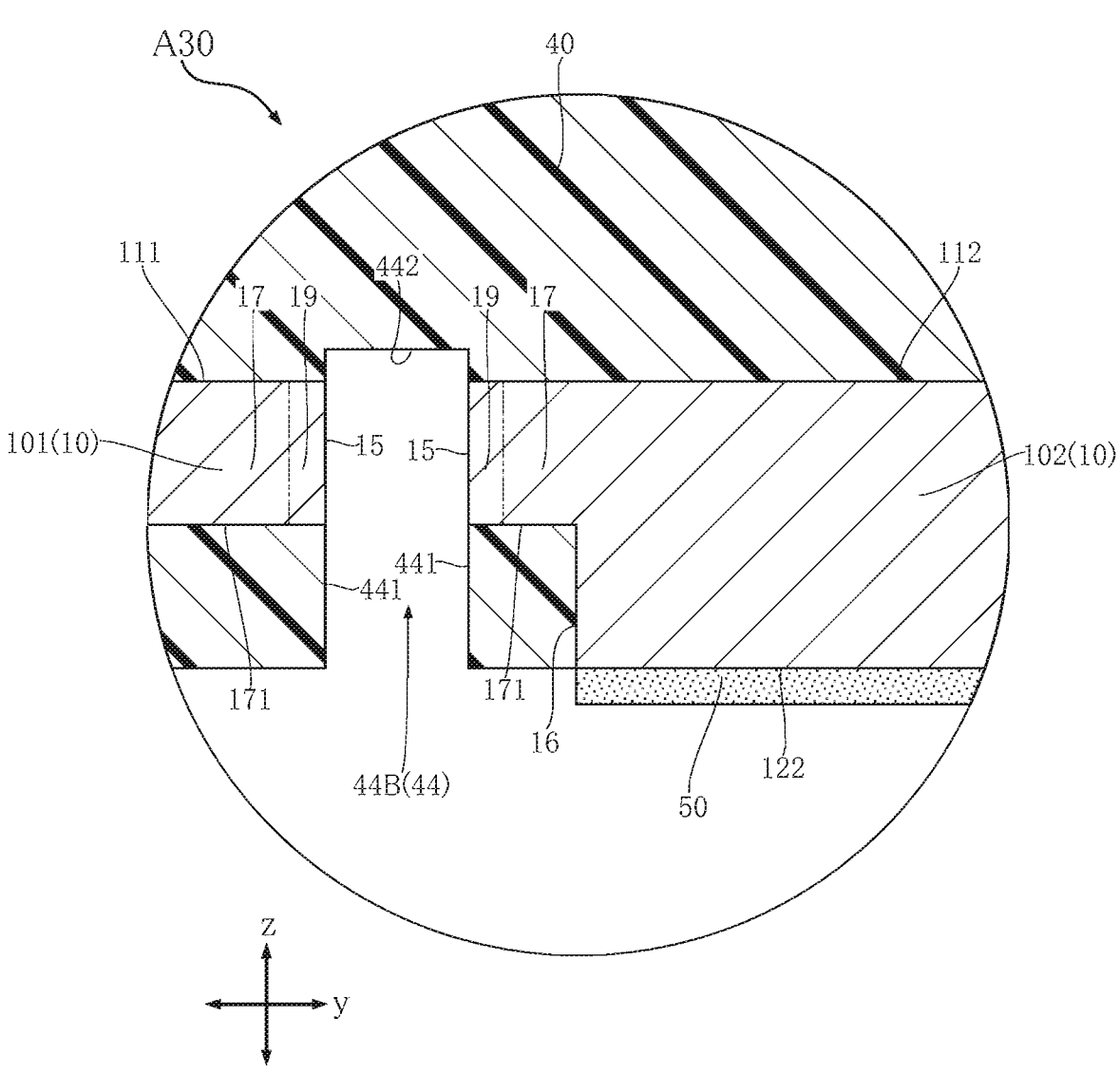
FIG. 43 is a partially enlarged view of FIG. 40.

As shown in FIG. 39, the fourth lead 104 is located next to the first lead 101 with the first groove 44A between them. The third lead 103 is located next to the second lead 102 with the first groove 44A between them. The region of the inner end surface 15 of the first lead 101 that faces in the second direction y, the inner end surface 15 of the fourth lead 104, the region of the inner end surface 15 of the second lead 102 that faces in the second direction y and the inner end surface 15 of the third lead 103 are exposed at the inner side surface 441 of the first groove 44A. As shown in FIGS. 39 and 43, the first lead 101 is located next to the second lead 102 with the second groove 44B between them. The region of the inner end surface 15 of the first lead 101 that faces in the first direction x and the region of the inner end surface 15 of the second lead 102 that faces in the first direction x are exposed at the inner side surface 441 of the second groove 44B.

The effect and advantages of the semiconductor device A30 are described below.

The semiconductor device A30 includes the second lead 102 having the reverse surface 122 and the side surface 13 that are exposed from the sealing resin 40, and the coating layer 50 covering the reverse surface 122 and the side surface 13. The sealing resin 40 is formed with the recess 44 having the inner side surfaces 441 and recessed from the bottom surface 42. The second lead 102 and at least one of the first lead 101 and the third lead 103 located next to the second lead 102 with the recess 44 therebetween have the inner end surfaces 15 exposed at the inner side surface 441. Thus, the semiconductor device A30 also makes it possible to efficiently form the coating layer 50 that covers the reverse surface 122 and the side surface 13 of the lead 10 (the second lead 102) exposed from the sealing resin 40. Moreover, the semiconductor device A30 has a configuration similar to that of semiconductor device A10, and hence has the same advantages as the semiconductor device A10.

In the semiconductor device A30, the recess 44 of the sealing resin 40 includes the first groove 44A extending in the first direction x and the second groove 44B extending in the second direction y. The inner end surface 15 of the second lead 102 includes the region facing in the first direction x and the region facing in the second direction y. Therefore, even with the configuration in which the second lead 102 and the third lead 103 do not have the first outer end surface 141, the coating layer 50 covering the reverse surfaces 122 and the side surfaces 13 of the second lead 102 and the third lead 103 can be easily formed by electrolytic plating.

As viewed in the thickness direction z, the conducting members 30 are spaced apart from the inner end surfaces 15 of the leads 10. This reduces the risk of the conducting members 30 being cut together with the connecting strips 82 in the step of cutting the connecting strip 82 (see FIG. 17) in the manufacturing process of the semiconductor device A30.

Figure 44:
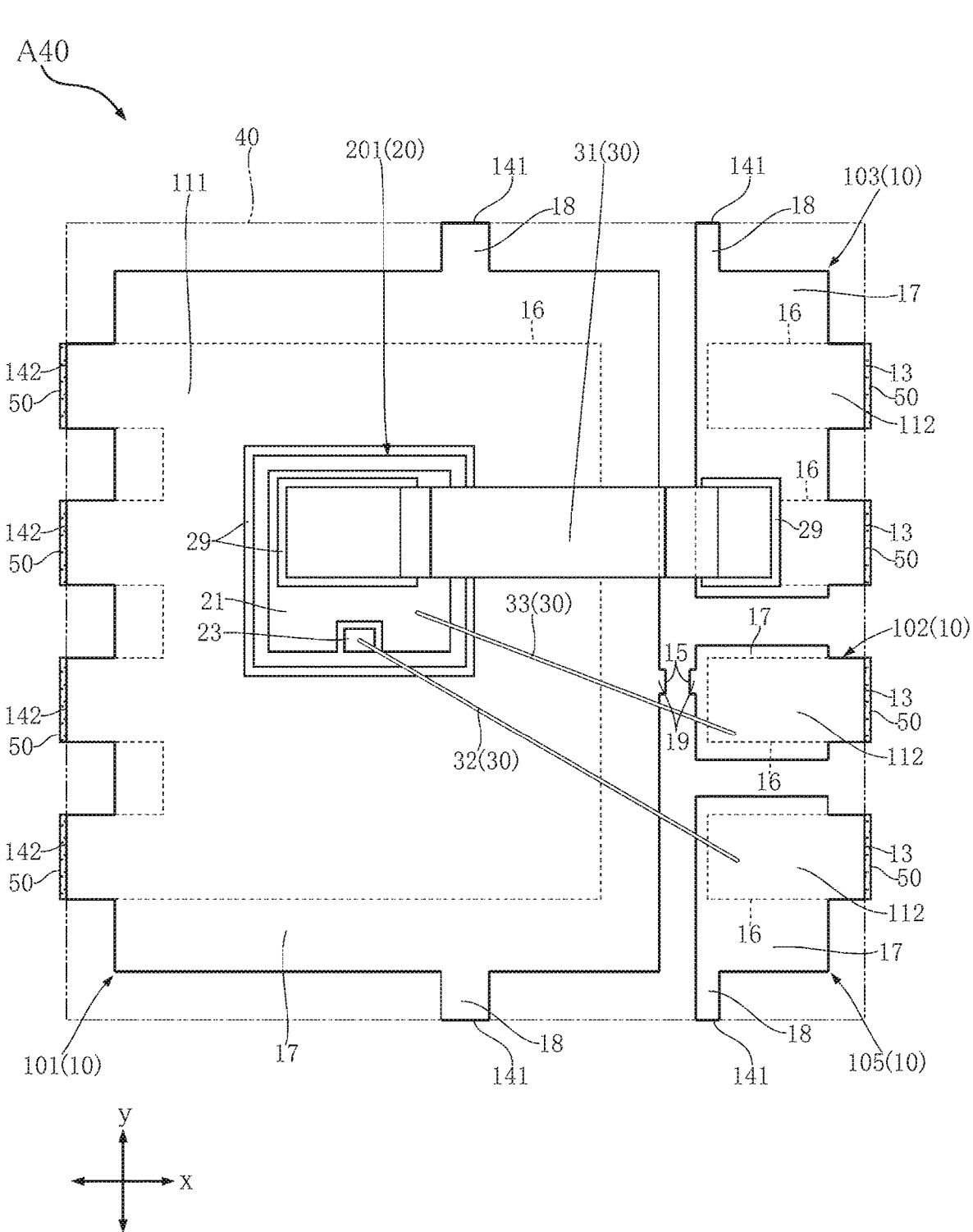
FIG. 44 is a plan view of a semiconductor device according to a fourth embodiment of the present disclosure, as seen through a sealing resin.

A semiconductor device A40 according to a fourth embodiment of the present disclosure is described below based on FIGS. 44 and 45. In these figures, the elements that are identical or similar to those of the semiconductor device A10 described above are denoted by the same reference signs as those used for the semiconductor device A10, and descriptions thereof are omitted. For convenience of understanding, the sealing resin 40 is transparent in FIG. 44. In FIG. 44, the sealing resin 40 is indicated by imaginary lines.

The semiconductor device A40 differs from the semiconductor device A10 described above in configurations of the leads 10, the conducting members 30 and the sealing resin 40. In the semiconductor device A40, the semiconductor element 20 is a single semiconductor element 201.

Figure 45:
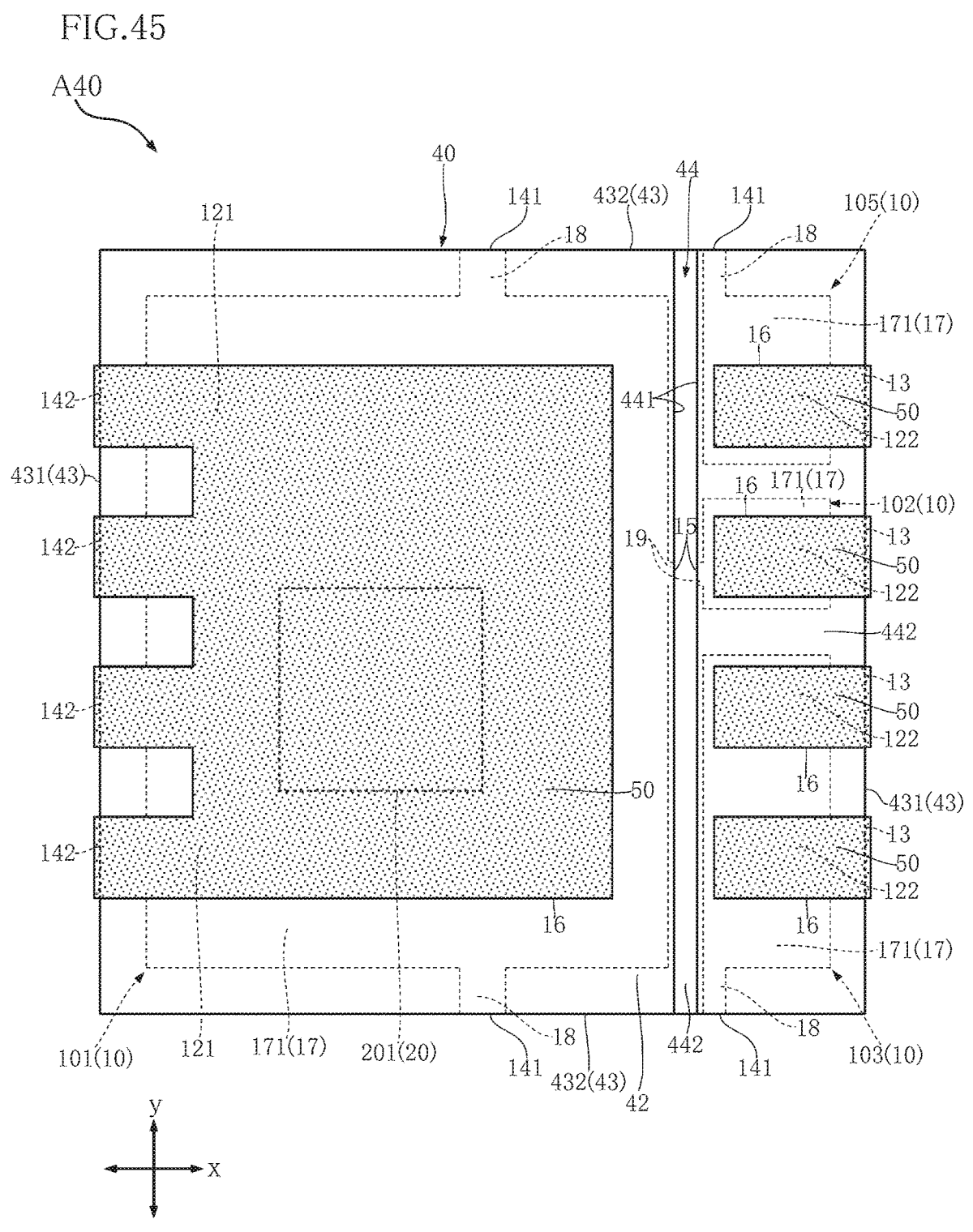

As shown in FIGS. 44 and 45, the plurality of leads 10 include a first lead 101, a second lead 102, a third lead 103 and a fifth lead 105. The semiconductor device A40 does not include the fourth lead 104. The first lead 101 has an element-mounting surface 111, a mounting surface 121, two first outer end surfaces 141, four second outer end surfaces 142, an inner end surface 15, an inner peripheral surface 16, an eave portion 17, two outer protrusions 18 and an inner protrusion 19. The inner end surface 15 of the first lead 101 faces inward in the sealing resin 40 in the first direction x. Accordingly, the inner protrusion 19 of the first lead 101 protrudes from the eave portion 17 inward in the first direction x in the sealing resin 40. The configuration of the first lead 101 corresponds to the first lead 101 and the fourth lead 104 of the semiconductor device A10 combined into a single unit.

As shown in FIGS. 44 and 45, the second lead 102 has an obverse surface 112, a reverse surface 122, a side surface 13, an inner end surface 15, an inner peripheral surface 16, an eave portion 17 and an inner protrusion 19. The inner end surface 15 of the second lead 102 faces in the first direction x. Accordingly, the inner protrusion 19 of the second lead 102 protrudes from the eave portion 17 in the first direction x. The configuration of the third lead 103 is the same as that of the third lead 103 of the semiconductor device A10, and the description thereof is omitted. Also, the configuration of the fifth lead 105 is the same as that of the fifth lead 105 of the semiconductor device A30, and the description thereof is omitted.

In the semiconductor device A40, the first semiconductor element 201 (the semiconductor element 20) is an n-channel MOSFET (Metal-Oxide-Semiconductor Field-Effect Transistor) of a vertical structure type, as with the semiconductor device A30.

As shown in FIG. 44, the plurality of conducting members 30 include a first member 31, a second member 32 and a third member 33. The first member 31 is bonded to the first electrode 21 of the first semiconductor element 201 and the obverse surface 112 of the third lead 103 via bonding layers 29. Thus, the first electrode 21 of the first semiconductor element 201 is electrically connected to the third lead 103. The second member 32 is bonded to the gate electrode 23 of the first semiconductor element 201 and the obverse surface 112 of the fifth lead 105. Thus, the gate electrode 23 of the first semiconductor element 201 is electrically connected to the fifth lead 105. The third member 33 is bonded to the first electrode 21 of the first semiconductor element 201 and the obverse surface 112 of the second lead 102. Thus, the first electrode 21 of the first semiconductor element 201 is electrically connected to the second lead 102. The third member 33 is a wire. The composition of the third member 33 includes gold. Alternatively, the composition of the third member 33 may include aluminum or copper.

As shown in FIG. 45, the recess 44 of the sealing resin 40 is a groove extending in the second direction y. Opposite ends of the recess 44 in the second direction y are connected to the pair of second surfaces 432 of the outer side surface 43. The first lead 101 is located next to the second lead 102 with the recess 44 between them. The inner end surface 15 of the first lead 101 and the inner end surface 15 of the second lead 102 are exposed at the inner side surface 441 of the recess 44.

The effect and advantages of the semiconductor device A40 are described below.

The semiconductor device A40 includes the second lead 102 having the reverse surface 122 and the side surface 13 that are exposed from the sealing resin 40, and the coating layer 50 covering the reverse surface 122 and the side surface 13. The sealing resin 40 is formed with the recess 44 having the inner side surface 441 and recessed from the bottom surface 42. The second lead 102 and at least one of the first lead 101 and the third lead 103 located next to the second lead 102 with the recess 44 therebetween have the inner end surfaces 15 exposed at the inner side surface 441. Thus, the semiconductor device A40 also makes it possible to efficiently form the coating layer 50 that covers the reverse surface 122 and the side surface 13 of the lead 10 (the second lead 102) exposed from the sealing resin 40. Moreover, the semiconductor device A40 has a configuration similar to that of semiconductor device A10, and hence has the same advantages as the semiconductor device A10.

In the semiconductor device A40, the semiconductor element 20 is a single semiconductor element 201. In this way, the present disclosure is applicable regardless of the number of the semiconductor elements 20.

Figure 46:
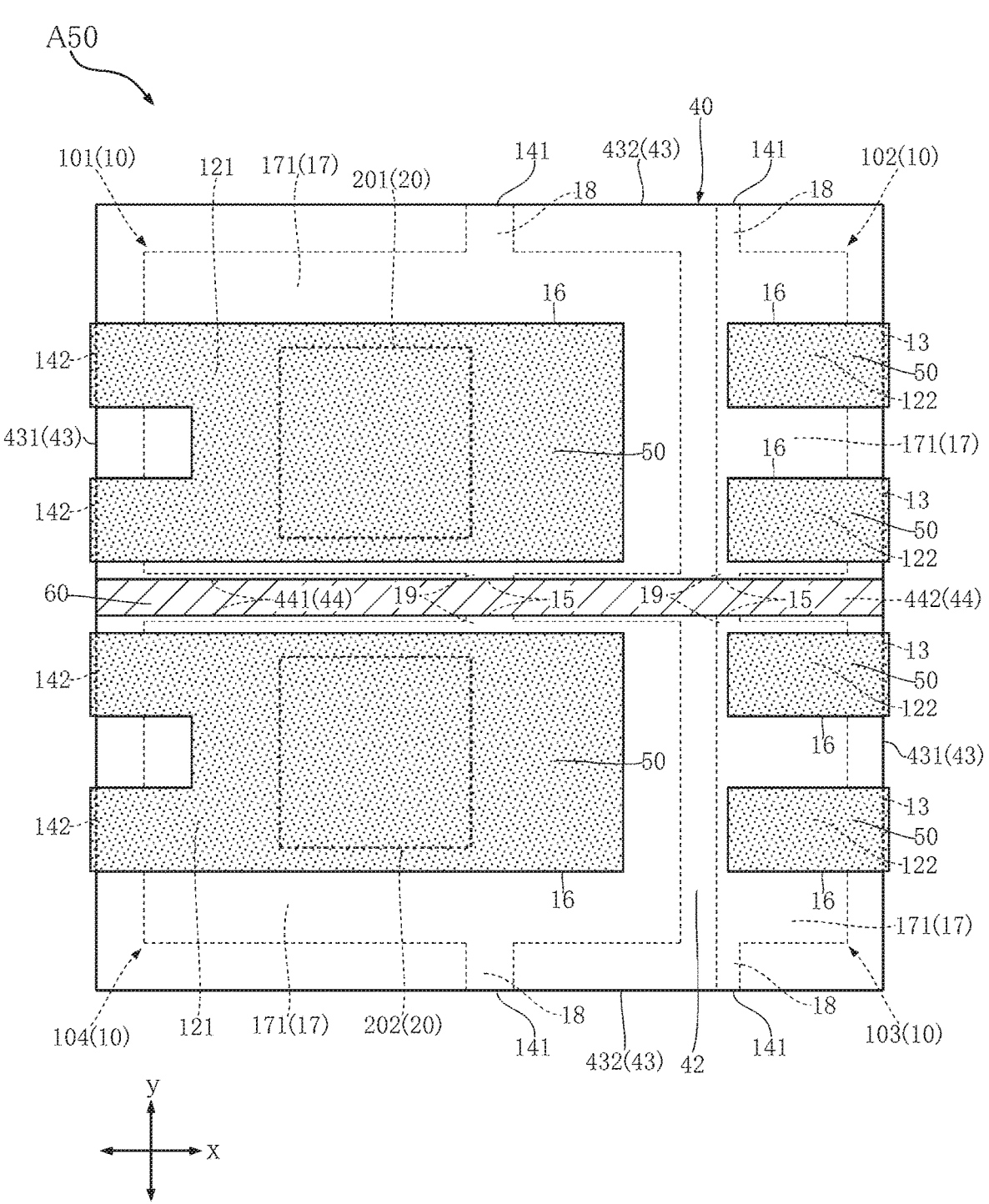
FIG. 46 is a bottom view of a semiconductor device according to a fifth embodiment of the present disclosure.
Figure 47:
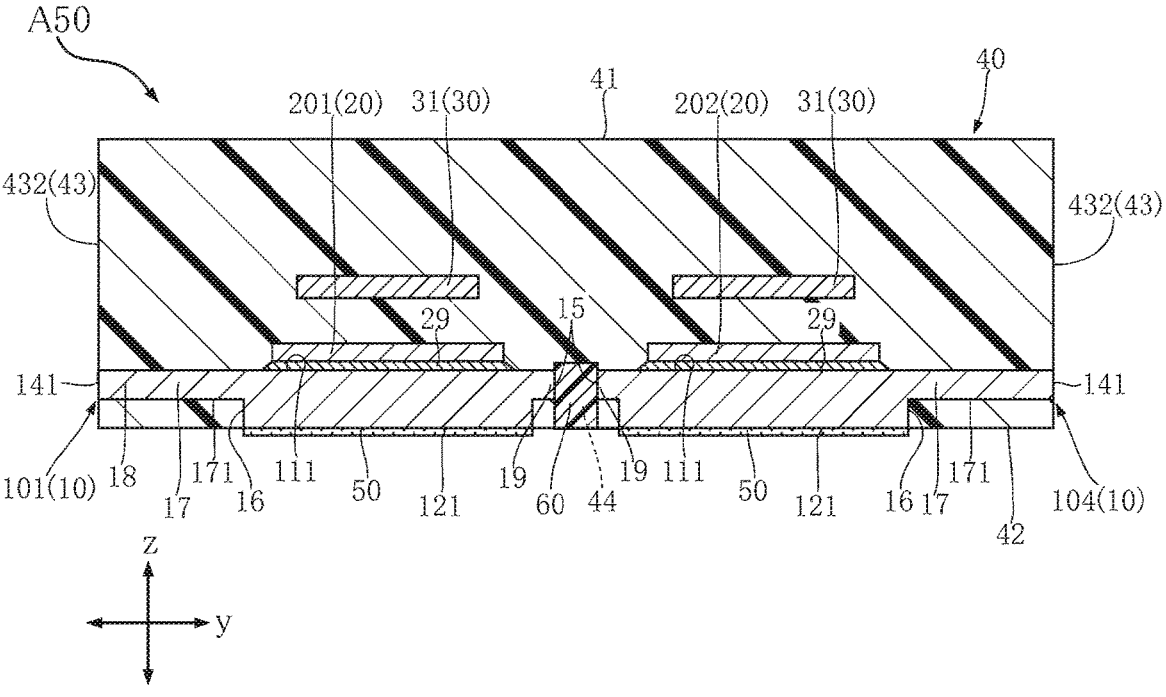
FIG. 47 is a sectional view of the semiconductor device shown in FIG. 46.
Figure 48:
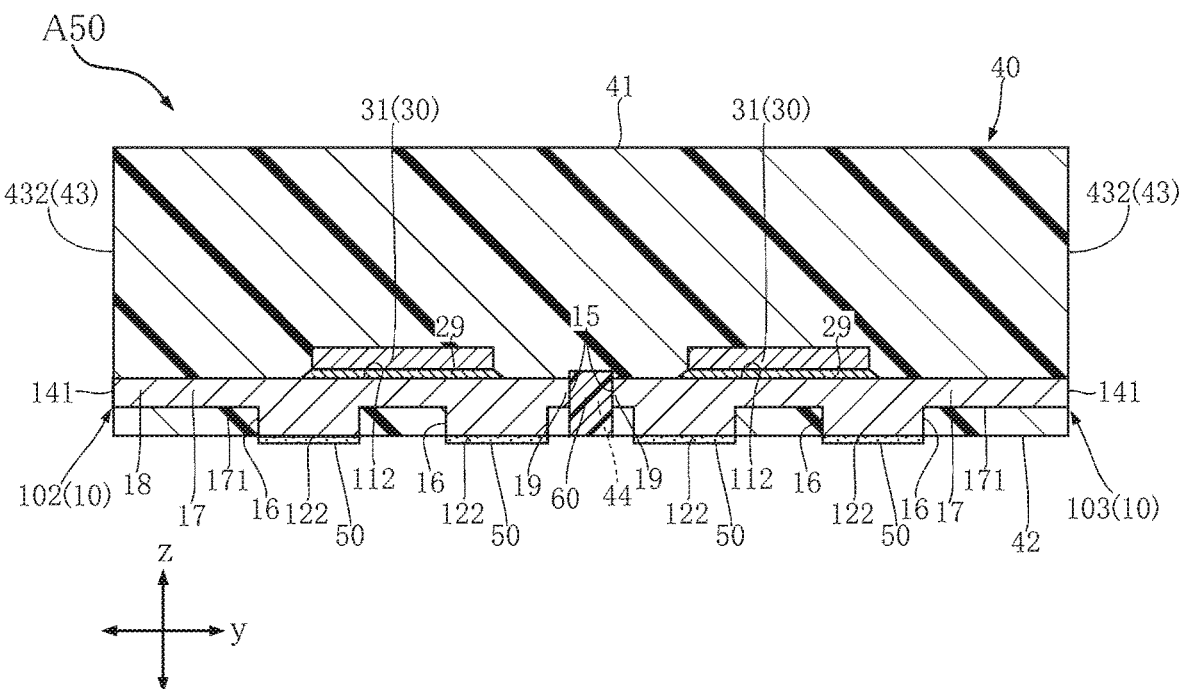
FIG. 48 is a sectional view of the semiconductor device shown in FIG. 46.
Figure 49:
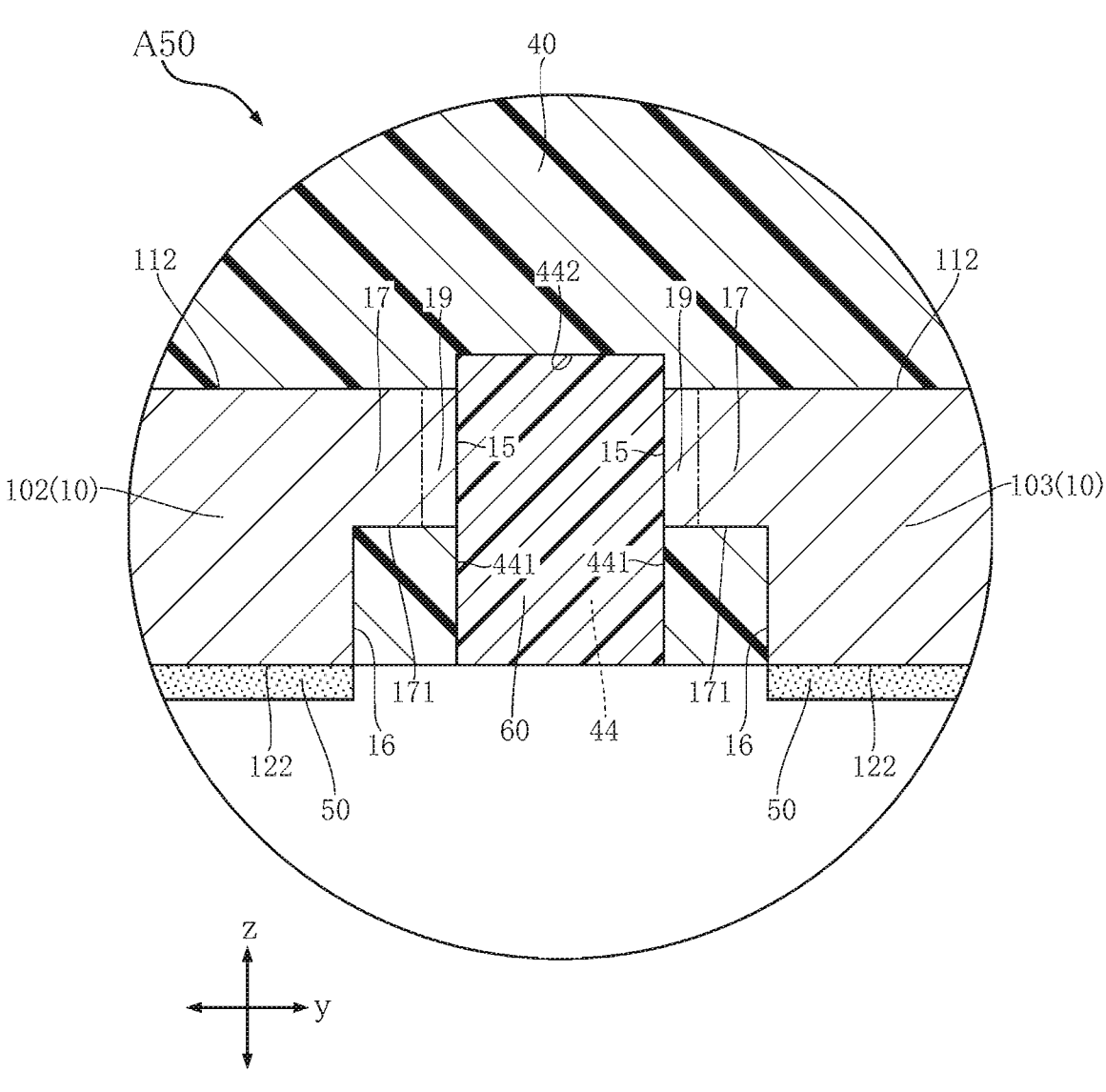
FIG. 49 is a partially enlarged view of FIG. 48.

A semiconductor device A50 according to a fifth embodiment of the present disclosure is described below based on FIGS. 46 to 49. In these figures, the elements that are identical or similar to those of the semiconductor device A10 described above are denoted by the same reference signs as those used for the semiconductor device A10, and descriptions thereof are omitted. For convenience of understanding, the sealing resin 40 is transparent in FIG. 46. In FIG. 46, the sealing resin 40 is indicated by imaginary lines. Note that FIG. 47 is a sectional view taken along the same plane as FIG. 8 that shows the semiconductor device A10. FIG. 48 is a sectional view taken along the same plane as FIG. 9 that shows the semiconductor device A10.

The semiconductor device A50 differs from the semiconductor device A10 in that the semiconductor device A50 further includes an insulator 60.

As shown in FIGS. 46 to 49, the insulator 60 fills the recess 44 of the sealing resin 40. The insulator 60 may be a resin used for an under-fill process, for example. The inner end surface 15 of each of the leads 10 is covered with the insulator 60. The insulator 60 is held in contact with intermediate surface 442 of the recess 44. The insulator 60 may be spaced apart from the intermediate surface 442 as long as the insulator 60 covers two inner end surfaces 15 that face each other with the recess 44 between them.

The semiconductor device A50 includes the second lead 102 having the reverse surface 122 and the side surface 13 that are exposed from the sealing resin 40, and the coating layer 50 covering the reverse surface 122 and the side surface 13. The sealing resin 40 is formed with the recess 44 having the inner side surface 441 and recessed from the bottom surface 42. The second lead 102 and at least one of the first lead 101 and the third lead 103 located next to the second lead 102 with the recess 44 therebetween have the inner end surfaces 15 exposed at the inner side surface 441. Thus, the semiconductor device A50 also makes it possible to efficiently form the coating layer 50 that covers the reverse surface 122 and the side surface 13 of the lead 10 (the second lead 102) exposed from the sealing resin 40. Moreover, the semiconductor device A50 has a configuration similar to that of semiconductor device A10, and hence has the same advantages as the semiconductor device A10.

The semiconductor device A50 further includes the insulator 60 filling the recess 44 of the sealing resin 40. Thus, when the semiconductor device A50 is mounted on a wiring board, solder does not adhere to the inner end surfaces 15 of two leads 10 that are adjacent to each other with the recess 44 between them. This prevents a short circuit between two adjacent leads 10 adjacent to each other with the recess 44 between them.

The present disclosure is not limited to the foregoing embodiments. The specific configuration of each part of the present disclosure can be varied in design in many ways.

The present disclosure includes the embodiments described in the following clauses.

Clause 1

A semiconductor device comprising:
a first lead;
a second lead located next to the first lead in a direction orthogonal to a thickness direction of the first lead;
a third lead located next to the second lead in the direction orthogonal to the thickness direction;
a first semiconductor element mounted on the first lead and electrically connected to the second lead;
a sealing resin covering a part of each of the first lead, the second lead and the third lead, and the first semiconductor element; and
a coating layer containing a metal element, wherein
the sealing resin includes a bottom surface facing in the thickness direction and an outer side surface connected to the bottom surface and facing outward from the sealing resin in the direction orthogonal to the thickness direction,
the sealing resin is formed with a recess that is recessed from the bottom surface,
the recess includes an inner side surface connected to the bottom surface and facing inward in the sealing resin in the direction orthogonal to the thickness direction,
the second lead includes a reverse surface exposed at the bottom surface and a side surface connected to the reverse surface and exposed at the outer side surface,
the coating layer covers the reverse surface and the side surface,
the recess is located between the first lead and the second lead, and
the second lead and at least one of the first lead and the third lead include inner end surfaces exposed at the inner side surface.

Clause 2

The semiconductor device according to clause 1, wherein the recess is a groove extending in the direction orthogonal to the thickness direction,
the inner side surface includes a pair of regions spaced apart from each other in a direction orthogonal to the thickness direction and the direction in which the recess extends, and
the inner end surfaces are exposed at the pair of regions.

Clause 3

The semiconductor device according to clause 2, wherein the bottom surface is divided by the recess into a plurality of regions.

Clause 4

The semiconductor device according to clause 3, wherein the recess includes a first groove and a second groove, and the second groove crosses the first groove.

Clause 5

The semiconductor device according to any one of clauses 1 to 4, wherein the inner end surface of the second lead is spaced apart from the side surface.

Clause 6

The semiconductor device according to clause 5 wherein an area of the inner end surface of the second lead is smaller than an area of the side surface.

Clause 7

The semiconductor device according to clauses 6, wherein the inner end surface of the second lead is spaced apart from the reverse surface.

Clause 8

The semiconductor device according to clause 6 or 7, wherein the second lead includes an obverse surface facing away from the reverse surface in the thickness direction, and the inner end surface is connected to the obverse surface.

Clause 9

The semiconductor device according to clause 8, wherein the recess includes an intermediate surface facing a same side as the bottom surface in the thickness direction and connected to the inner side surface, and
the intermediate surface is farther away from the bottom surface than is the obverse surface.

Clause 10

The semiconductor device according to any one of clauses 1 to 9, wherein the first lead includes a first outer end surface exposed at the outer side surface, and
a direction in which the first outer end surface faces is different from a direction in which the side surface faces.

Clause 11

The semiconductor device according to clause 10, wherein the first lead includes a mounting surface exposed at the bottom surface, and
the first outer end surface is spaced apart from the mounting surface.

Clause 12

The semiconductor device according to clause 11, wherein an area of the mounting surface is larger than an area of the reverse surface.

Clause 13

The semiconductor device according to clause 11 or 12, wherein the first lead includes a second outer end surface connected to the mounting surface and exposed at the outer side surface, and the coating layer covers the mounting surface and the second outer end surface.

Clause 14

The semiconductor device according to clause 13, wherein a normal direction of the second outer end surface is coaxial with a normal direction of the side surface, and the second outer end surface faces away from the side surface.

Clause 15

The semiconductor device according to clause 14, wherein an area of the second outer end surface is larger than an area of the first outer end surface.

Clause 16

The semiconductor device according to any one of clauses 1 to 15, further comprising:
a fourth lead located next to the first lead in the direction orthogonal to the thickness direction; and
a second semiconductor element mounted on the fourth lead and electrically connected to the third lead, wherein
the sealing resin covers a part of the fourth lead and the second semiconductor element,
the recess is located also between the first lead and the fourth lead, and
the first lead and the fourth lead include the inner end surfaces.

Clause 17

A method for manufacturing a semiconductor device, the method comprising the steps of:
mounting a semiconductor element on one of a plurality of leads each including a reverse surface and a side surface connected to the reverse surface; and
forming a sealing resin covering a part of each of the plurality of leads and the semiconductor element,
the step of forming the sealing resin including exposing the reverse surface and the side surface of at least one of the plurality of leads from the sealing resin,
at least two of the plurality of leads being connected to each other with a connecting strip having a same composition as the plurality of leads,
the method further comprising the steps of: after the step of forming the sealing resin, forming by electrolytic plating a coating layer covering the reverse surface and the side surface exposed from the sealing resin and containing a metal element; and
after the step of forming the coating layer, cutting the connecting strip by removing a part of the sealing resin from a side on which the reverse surface is exposed.

REFERENCE NUMERALS

A10, A20, A30: Semiconductor device 10: Lead
101: First lead 102: Second lead
103: Third lead 104: Fourth lead
105: Fifth lead 106: Sixth lead
111: Element-mounting surface 112: Obverse surface
121: Mounting surface 122: Reverse surface
13: Side surface 141: First outer end surface
142: Second outer end surface 15: Inner end surface 16: Inner peripheral surface 17: Eave portion
171: Overhang surface 18: Outer protrusion
19: Inner protrusion 20: Semiconductor element
201: First semiconductor element
202: Second semiconductor element
21: First electrode 22: Second electrode
23: Gate electrode 29: Bonding layer
30: Conducting member 31: First member
32: Second member 33: Third member
40: Sealing resin 41: Top surface
42: Bottom surface 43: Outer side surface
431: First surface 431A: First region
431B: Second region 431C: Third region
432: Second surface 44: Recess
441: Inner side surface 442: Intermediate surface
50: Coating layer 60: Insulator
80: Frame 801: First frame portion
802: Second frame portions 81: Tie bar
82: Connecting strip 83: Groove
z: Thickness direction x: First direction
y: Second direction

The invention claimed is:
1. A semiconductor device comprising:
a first lead;
a second lead located next to the first lead in a direction orthogonal to a thickness direction of the first lead;
a third lead located next to the second lead in the direction orthogonal to the thickness direction;
a first semiconductor element mounted on the first lead and electrically connected to the second lead;
a sealing resin covering a part of each of the first lead, the second lead and the third lead, and the first semiconductor element; and
a coating layer containing a metal element, wherein
the sealing resin includes a bottom surface facing in the thickness direction and an outer side surface connected to the bottom surface and facing outward from the sealing resin in the direction orthogonal to the thickness direction,
the sealing resin is formed with a recess that is recessed from the bottom surface,
the recess includes an inner side surface connected to the bottom surface and facing inward in the sealing resin in the direction orthogonal to the thickness direction,
the second lead includes a reverse surface exposed at the bottom surface and a side surface connected to the reverse surface and exposed at the outer side surface,
the coating layer covers the reverse surface and the side surface,
the recess is located between the first lead and the second lead, and
the second lead and at least one of the first lead and the third lead include inner end surfaces exposed at the inner side surface.
2. The semiconductor device according to claim 1, wherein the recess is a groove extending in the direction orthogonal to the thickness direction,
the inner side surface includes a pair of regions spaced apart from each other in a direction orthogonal to the thickness direction and the direction in which the recess extends, and
the inner end surfaces are exposed at the pair of regions.
3. The semiconductor device according to claim 2, wherein the bottom surface is divided by the recess into a plurality of regions.

4. The semiconductor device according to claim 3, wherein the recess includes a first groove and a second groove, and the second groove crosses the first groove.

5. The semiconductor device according to claim 1, wherein the inner end surface of the second lead is spaced apart from the side surface.

6. The semiconductor device according to claim 5 wherein an area of the inner end surface of the second lead is smaller than an area of the side surface.

7. The semiconductor device according to claim 6, wherein the inner end surface of the second lead is spaced apart from the reverse surface.

8. The semiconductor device according to claim 6, wherein the second lead includes an obverse surface facing away from the reverse surface in the thickness direction, and the inner end surface is connected to the obverse surface.

9. The semiconductor device according to claim 8, wherein the recess includes an intermediate surface facing a same side as the bottom surface in the thickness direction and connected to the inner side surface, and the intermediate surface is farther away from the bottom surface than is the obverse surface.

10. The semiconductor device according to claim 1, wherein the first lead includes a first outer end surface exposed at the outer side surface, and a direction in which the first outer end surface faces is different from a direction in which the side surface faces.

11. The semiconductor device according to claim 10, wherein the first lead includes a mounting surface exposed at the bottom surface, and the first outer end surface is spaced apart from the mounting surface.

12. The semiconductor device according to claim 11, wherein an area of the mounting surface is larger than an area of the reverse surface.

13. The semiconductor device according to claim 11, wherein the first lead includes a second outer end surface connected to the mounting surface and exposed at the outer side surface, and the coating layer covers the mounting surface and the second outer end surface.

14. The semiconductor device according to claim 13, wherein a normal direction of the second outer end surface is coaxial with a normal direction of the side surface, and the second outer end surface faces away from the side surface.

15. The semiconductor device according to claim 14, wherein an area of the second outer end surface is larger than an area of the first outer end surface.

16. The semiconductor device according to claim 1, further comprising:

a fourth lead located next to the first lead in the direction orthogonal to the thickness direction; and a second semiconductor element mounted on the fourth lead and electrically connected to the third lead, wherein the sealing resin covers a part of the fourth lead and the second semiconductor element, the recess is located also between the first lead and the fourth lead, and the first lead and the fourth lead include the inner end surfaces.

17. A method for manufacturing a semiconductor device, the method comprising the steps of:

mounting a semiconductor element on one of a plurality of leads each including a reverse surface and a side surface connected to the reverse surface; and forming a sealing resin covering a part of each of the plurality of leads and the semiconductor element, the step of forming the sealing resin including exposing the reverse surface and the side surface of at least one of the plurality of leads from the sealing resin, at least two of the plurality of leads being connected to each other with a connecting strip having a same composition as the plurality of leads, the method further comprising the steps of: after the step of forming the sealing resin, forming by electrolytic plating a coating layer covering the reverse surface and the side surface exposed from the sealing resin and containing a metal element; and after the step of forming the coating layer, cutting the connecting strip by removing a part of the sealing resin from a side on which the reverse surface is exposed.

* * * * *